(12) United States Patent
Nosaka et al.

(10) Patent No.: US 12,712,445 B2
(45) Date of Patent: Aug. 18, 2026

(54) SWITCHING CIRCUIT AND POWER CONVERTER

(71) Applicant: OMRON Corporation, Kyoto (JP)

(72) Inventors: Noriyuki Nosaka, Kyoto (JP); Mamoru Sueki, Kyoto (JP); Satoshi Iwai, Kyoto (JP); Junya Mishima, Kyoto (JP); Hironori Tauchi, Kyoto (JP); Wataru Okada, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 258 days.

(21) Appl. No.: 18/686,713

(22) PCT Filed: Mar. 29, 2022

(86) PCT No.: PCT/JP2022/015378
§ 371 (c)(1),
(2) Date: Feb. 26, 2024

(87) PCT Pub. No.: WO2023/037635
PCT Pub. Date: Mar. 16, 2023

(65) Prior Publication Data
US 2024/0364213 A1 Oct. 31, 2024

(30) Foreign Application Priority Data
Sep. 13, 2021 (JP) ................................ 2021-148827

(51) Int. Cl.
*H02M 1/44* (2007.01)
*H02M 1/08* (2006.01)
(Continued)

(52) U.S. Cl.
CPC .............. *H02M 1/44* (2013.01); *H02M 1/08* (2013.01); *H02M 7/537* (2013.01); *H03K 17/16* (2013.01)

(58) Field of Classification Search
CPC .......... H02M 1/44; H02M 1/08; H02M 7/537; H03K 17/16
See application file for complete search history.

(56) References Cited

U.S. PATENT DOCUMENTS 5,140,201 A 8/1992 Uenishi
8,451,045 B2 * 5/2013 Yim ....................... H02M 1/32 327/434
(Continued)

FOREIGN PATENT DOCUMENTS

JP 2008042633 A 2/2008
JP 2018011144 A 1/2018
(Continued)

OTHER PUBLICATIONS

International Search Report issued in Intl. Appln. No. PCT/JP2022/015378 mailed Jun. 21, 2022. English translation provided.
(Continued)

*Primary Examiner* — Kyle J Moody
(74) *Attorney, Agent, or Firm* — ROSSI, KIMMS & McDOWELL LLP

(57) ABSTRACT

A switching circuit including: a switching device configured to conduct or open a state between a drain terminal and a source terminal; a drive circuit including a first switch element and a second switch element, the drive circuit being configured to open and close the first switch element and the second switch element, and output a drive voltage for driving the switching device to the gate terminal via an output end; a clamp circuit including a third switch element configured to conduct between a reference potential of the drive circuit and a connection point of a path connecting the output end of the drive circuit and the gate terminal; and a ferrite inductor provided immediately near the output end of
(Continued)

the drive circuit, and having one end connected to the output end and the other end connected to the connection point.

7 Claims, 21 Drawing Sheets

(51) Int. Cl.
*H02M 7/537* (2006.01)
*H03K 17/16* (2006.01)

(56) References Cited

U.S. PATENT DOCUMENTS

| | | | | |
|---|---|---|---|---|
| 9,300,285 | B2 * | 3/2016 | Pang | H03K 17/08104 |
| 11,652,473 | B2 * | 5/2023 | Curbow | H03K 3/013 327/109 |
| 2009/0058499 | A1 * | 3/2009 | Yamashiro | H03K 3/012 327/432 |
| 2010/0283515 | A1 * | 11/2010 | Kelley | H03K 17/04123 327/109 |
| 2012/0153998 | A1 * | 6/2012 | Kitamura | H03K 17/04106 327/109 |
| 2012/0306545 | A1 * | 12/2012 | Machida | H02M 3/1588 327/109 |
| 2016/0261266 | A1 * | 9/2016 | Kampl | H03K 17/165 |
| 2018/0019686 | A1 | 1/2018 | Ikeda | |
| 2018/0175833 | A1 | 6/2018 | Curbow et al. | |
| 2018/0175853 | A1 | 6/2018 | Curbow et al. | |
| 2019/0181856 | A1 | 6/2019 | Kato et al. | |
| 2021/0320653 | A1 | 10/2021 | Nosaka et al. | |

FOREIGN PATENT DOCUMENTS

| | | | |
|---|---|---|---|
| JP | 2018033280 | A | 3/2018 |
| JP | 2019146353 | A | 8/2019 |
| JP | 6645924 | B2 | 2/2020 |
| JP | 2020068631 | A | 4/2020 |
| JP | 2020517125 | A | 6/2020 |
| WO | 2020003634 | A1 | 1/2020 |

OTHER PUBLICATIONS

Written Opinion issued in Intl. Appln. No. PCT/JP2022/015378 mailed Jun. 21, 2022. English translation provided.

Extended European Search Report issued in European Appln. No. 22866967.7 mailed Jun. 16, 2025.

* cited by examiner 300
301 (Gate driver)
303
302 (GaN GIT)
$V_s$
$V_{sig}$
S1
S2
T1
GND
$R_p$=1.5kΩ
$D_p$
$R_{goff}$ =22Ω
G
$C_{gd}$
$C_{gs}$
$C_{ds}$
D1
$V_{gs}$
$I_d$
D
S
$V_{ds}$
$V_{in}$ 300
301 (Gate driver)
302 (GaN GIT)
303
304
$V_{in}$
$V_{ds}$
$I_d$
D
S
G
$C_{ds}$
$C_{gs}$
$C_{gd}$
D1
$V_{gs}$
$R_p$=1.5kΩ
$D_p$
$R_{goff}$ =22Ω
FB
T1
S1
S2
$V_{sig}$
GND
$V_s$ 300
301 (Gate driver)
302
$C_{gd}$
$C_{gs}$
$C_{ds}$
D
S
G
D1
$V_{gs}$
FB
Z11
Z12
T1
S1
S2
$V_{sig}$
$V_s$
GND 100
101 (Gate driver)
102
103
103a
G
D
S
T2
T3
T4
FB
S3
S4
Cds
Cgd
Cgs
D1
Vgs
Qs
CLAMP
LOGIC
COM
Vth
Vsig
Vs
GND 100
D
S
G'
Cds
Cgd
Cgs
D1
Vgs
102
T3
Z1
Z2
FB
T4
Qs
CLAMP LOGIC
103a
COM
103
Vth
(Gate driver)
101
T2
S3
S4
Vsig
GND
Vs 200a
101 (Gate driver)
102
103
103a
D
S
G
$C_{ds}$
$C_{gd}$
$C_{gs}$
D1
$V_{gs}$
T3
FB
T2
T4
Z3
Z4
$Q_s$
CLAMP
LOGIC
COM
$V_{th}$
S3
S4
$V_{sig}$
$V_s$
GND 101
(Gate driver)
200b
102
D
Cgd
Vs
Vsig
S3
T2
Z5
T3
T4
G
COM
Qs
S4
Vth
CLAMP LOGIC
D1
Cgs
Cds
Vgs
Z6
FB
S
GND
103
103a 101(Gate driver)
100#1
104
$R_p$
102 (GaN GIT)
D
$V_{sig}$
S3
T2
FB
$D_p$
$R_{gon}$
V
T3
G
$C_{gd}$
$V_s$
$C_p$
$C_{ds}$
$C_{gs}$
103
T4
S4
COM
$Q_s$
$R_s$
$R_{goff}$
$V_{gs}$
$V_{th}$
CLAMP LOGIC
S
GND
105
103a
$C_s$ 200b#1
101(Gate driver)
104
102 (GaN GIT)
D
S
G
T2
T3
T4
Rp
Rgon
Rgoff
Dp
Cp
Cgd
Cgs
Cds
Vgs
103
COM
Qs
CLAMP
LOGIC
103a
Rs
Cs
105
FB
Vsig
Vs
S3
S4
Vth
GND

Figure 8A:
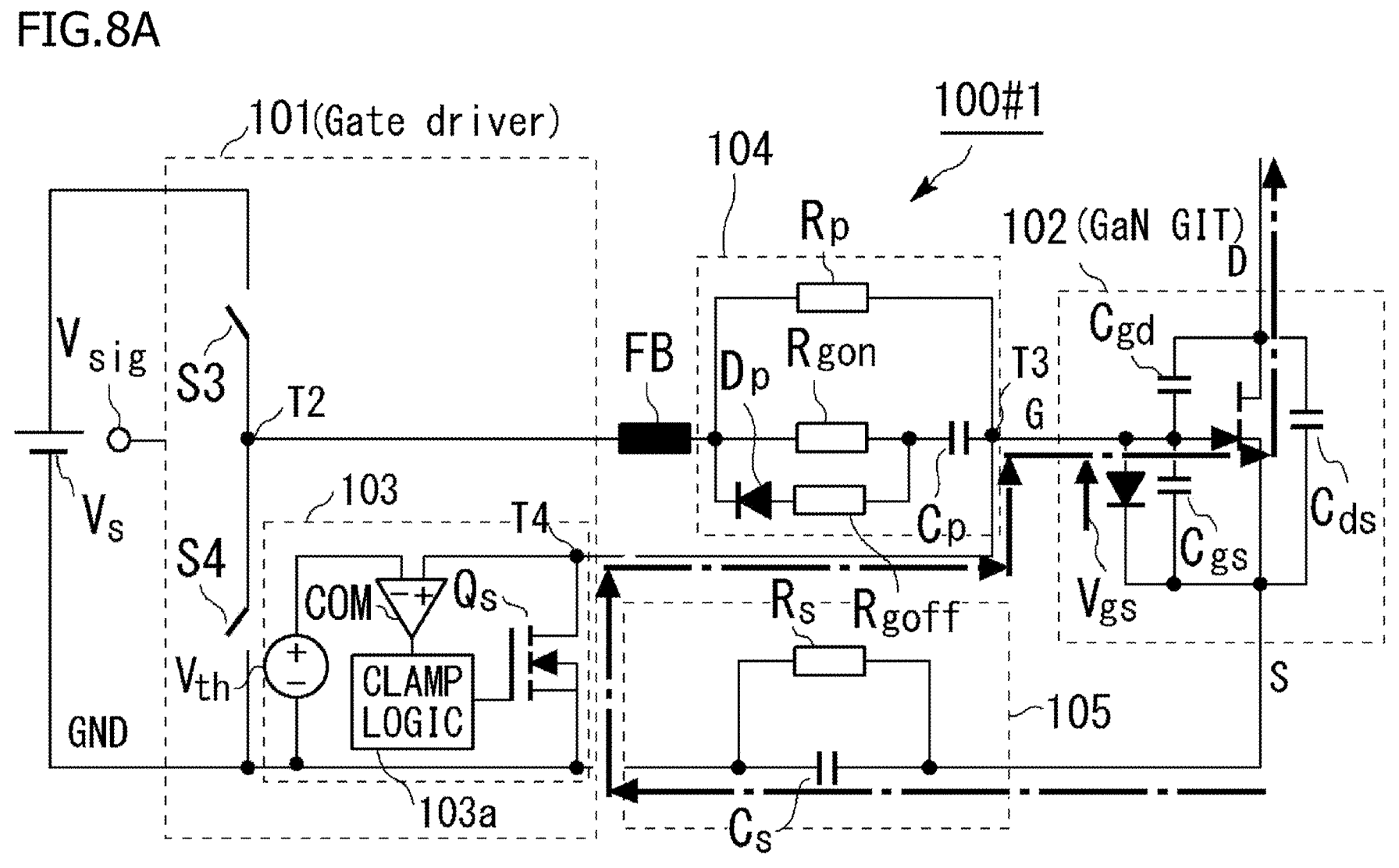

101(Gate driver)
102(GaN GIT)
103
103a
104
105
$V_{sig}$
$V_s$
GND
S3
S4
$V_{th}$
T2
T3
T4
FB
$R_p$
$R_{gon}$
$R_{goff}$
$D_p$
$C_p$
$R_s$
$C_s$
$Q_s$
COM
CLAMP LOGIC
G
D
S
$C_{gd}$
$C_{gs}$
$C_{ds}$
$V_{gs}$ 100a
102
D
S
G
$C_{ds}$
$C_{gs}$
$C_{gd}$
D1
$V_{gs}$
T3
$R_g$
FB
T4
$Q_s$
CLAMP LOGIC
103a
103
COM
$V_{th}$
101 (Gate driver)
T2
S3
S4
$V_{sig}$
GND
$V_s$ 100c
101 (Gate driver)
102
103
103a
CLAMP LOGIC
COM
Vth
Qs
T2
T3
T4
S3
S4
Vsig
Vs
GND
FB
Rg
Ds
G
D
S
Cgd
Cgs
Cds
D1
Vgs 100d
102
D
S
G
Cds
Cgd
Cgs
D1
Vgs
T3
Cp
Rg
Ds
T5
FB
T4
Qs
CLAMP LOGIC
103a
COM
103
Vth
101 (Gate driver)
T2
S3
S4
Vsig
GND
Vs

SWITCHING CIRCUIT AND POWER CONVERTER

FIELD

The present invention relates to a switching circuit and a power converter that suppress noise associated with a switching operation of a semiconductor device.

BACKGROUND

Conventionally, in order to suppress oscillation noise of a semiconductor device, it is known to add ferrite beads or the like immediately near a gate terminal connected to a gate driver (for example, Patent Literature 1). By adding the ferrite beads or the like, the impedance viewed from an input side of the gate terminal can be increased, so that the oscillation noise suppression caused by a parasitic capacitance (for example, a gate-drain capacitance) of the semiconductor device is expected.

CITATION LIST

Patent Literature

Patent Literature 1: Japanese Patent No. 6645924

SUMMARY

Technical Problem

However, the addition of the ferrite beads or the like immediately near the gate terminal may cause voltage fluctuation due to noise (hereinafter, also referred to as mirror noise) accompanying turn-on and turn-off of the semiconductor device. Such a voltage fluctuation becomes remarkable as the switching speed increases, and for example, there is a possibility that the voltage applied to the gate terminal increases, and malfunction or breakdown of the semiconductor device occurs.

The present invention has been made in view of the above circumstances, and an object of the present invention is to provide a technique capable of suppressing oscillation noise of a semiconductor device and suppressing mirror noise.

Solution to Problem

In a mode of the disclosed technology for solving the above problem, included are:

a switching device configured to conduct or open a state between a drain terminal and a source terminal based on a voltage applied between a gate terminal and the source terminal;

a drive circuit including a first switch element having one end connected to a positive electrode side of a control power supply and the other end connected to an output end, and a second switch element having one end connected to the output end and the other end connected to a reference potential to which a negative electrode side of the control power supply is connected, the drive circuit being configured to open and close the first switch element and the second switch element in accordance with a predetermined control signal, generate a drive voltage for driving the switching device, and output the generated drive voltage to the gate terminal of the switching device via the output end;

a clamp circuit including a third switch element configured to conduct between the reference potential of the drive circuit and a connection point of a path connecting the output end of the drive circuit and the gate terminal of the switching device based on a comparison result between a threshold potential generated based on the reference potential of the drive circuit and a potential at the connection point; and a ferrite inductor provided immediately near the output end of the drive circuit, and having one end connected to the output end and the other end connected to the connection point.

As a result, in a switching circuit 100 that is the switching circuit, a ferrite bead FB that is the ferrite inductor is provided immediately near a gate driver 101 that is the drive circuit, and a connection point T3 that is the connection point on a path where the ferrite bead FB and a gate terminal G of a semiconductor device 102 that is a switching device is connected to an input end (connection point T4) of a mirror clamp circuit 103 that is the clamp circuit can be configured to be connected. In the switching circuit 100, a closed loop of a propagation path through which oscillation noise propagates via a GND potential and a closed loop of a propagation path of mirror noise accompanying turn-on and turn-off of the semiconductor device 102 can be separated. The ferrite bead FB can be disposed in the propagation path through which the oscillation noise propagates, and the mirror clamp 103 that suppresses the mirror noise can be disposed without interposing the ferrite bead FB in the propagation path through which the mirror noise propagates. As a result, the oscillation noise propagated via the GND potential can be suppressed by the inductor of the ferrite bead FB, and the effect of suppressing the mirror noise by the mirror clamp circuit 103, which is propagated via the connection point T3, can be sufficiently enhanced. As a result, it is possible to provide a technique capable of suppressing the oscillation noise of the semiconductor device and suppressing the mirror noise.

Furthermore, in a mode of the disclosed technology, a resistance element connected in series with the ferrite inductor may be further included between the output end of the drive circuit and the connection point. As a result, the rise time (slew rate) of the gate voltage applied to the gate terminal G can be changed by adding a gate resistor Rg that is the resistance element, so that the switching speed related to turn-on and turn-off in the semiconductor device 102 can be changed. By changing the rise time of the gate voltage, it is possible to expect reduction of switching noise (mirror noise) accompanying turn-on and turn-off of the semiconductor device 102.

Furthermore, in a mode of the disclosed technology, a diode element in which an anode is connected to the reference potential of the drive circuit and a cathode is connected to the connection point may be further included. As a result, a Schottky diode Ds serving as the diode element can be disposed between the connection point T3 and the GND potential of the path through which the mirror noise propagates, and the impedance of the current path through which the switching noise (mirror noise) propagates can be reduced. The effect of reducing switching noise (mirror noise) accompanying turn-on and turn-off of the semiconductor device 102 can be further improved.

Furthermore, in a mode of the disclosed technology, a capacitor element may be connected in parallel to the resistance element connected in series with the ferrite inductor. As a result, by adding a capacitor Cp that is the capacitor element connected in parallel to the gate resistor Rg, the switching speed related to turn-on and turn-off of the semiconductor device 102 can be increased, so that the switching loss in the switching circuit can be expected to be reduced.

Furthermore, in a mode of the disclosed technology, the ferrite inductor may be an equivalent circuit corresponding to the ferrite inductor. As a result, the ferrite inductor can be appropriately configured using the inductor element and the resistance element according to characteristics of the oscillation noise to be suppressed, a circuit scale, and the like. Furthermore, in a mode of the disclosed technology, the switching device may include a wide bandgap semiconductor including at least a SiC semiconductor or a GaN semiconductor. As a result, it is possible to effectively suppress the mirror noise caused by a parasitic capacitance in the switching device including the wide bandgap semiconductor including the SiC semiconductor or the GaN semiconductor.

Furthermore, in another aspect of the disclosed technology, a power converter may include a switching circuit according to any one of claims 1 to 6 as a configuration. Even in such a form, it is possible to separate the closed loop of the propagation path through which the oscillation noise propagates via the GND potential and the closed loop of the propagation path of the mirror noise accompanying turn-on and turn-off of the semiconductor device 102. As a result, the oscillation noise propagated via the GND potential can be suppressed by the inductor of the ferrite bead FB, and the effect of suppressing the mirror noise by the mirror clamp circuit 103, which is propagated via the connection point T3, can be sufficiently enhanced.

Advantageous Effects

According to the mode of the present disclosure, it is possible to provide a technique capable of suppressing the oscillation noise of the semiconductor device and suppressing the mirror noise.

BRIEF DESCRIPTION OF THE DRAWINGS

FIGS. 8A and 8B are diagrams illustrating a result of an evaluation test of mirror noise suppression at the time of turn-off of the switching circuit according to the example of the present invention.

DETAILED DESCRIPTION

Application Examples

Hereinafter, application examples of the present invention will be described with reference to the drawings.

Figure 4:
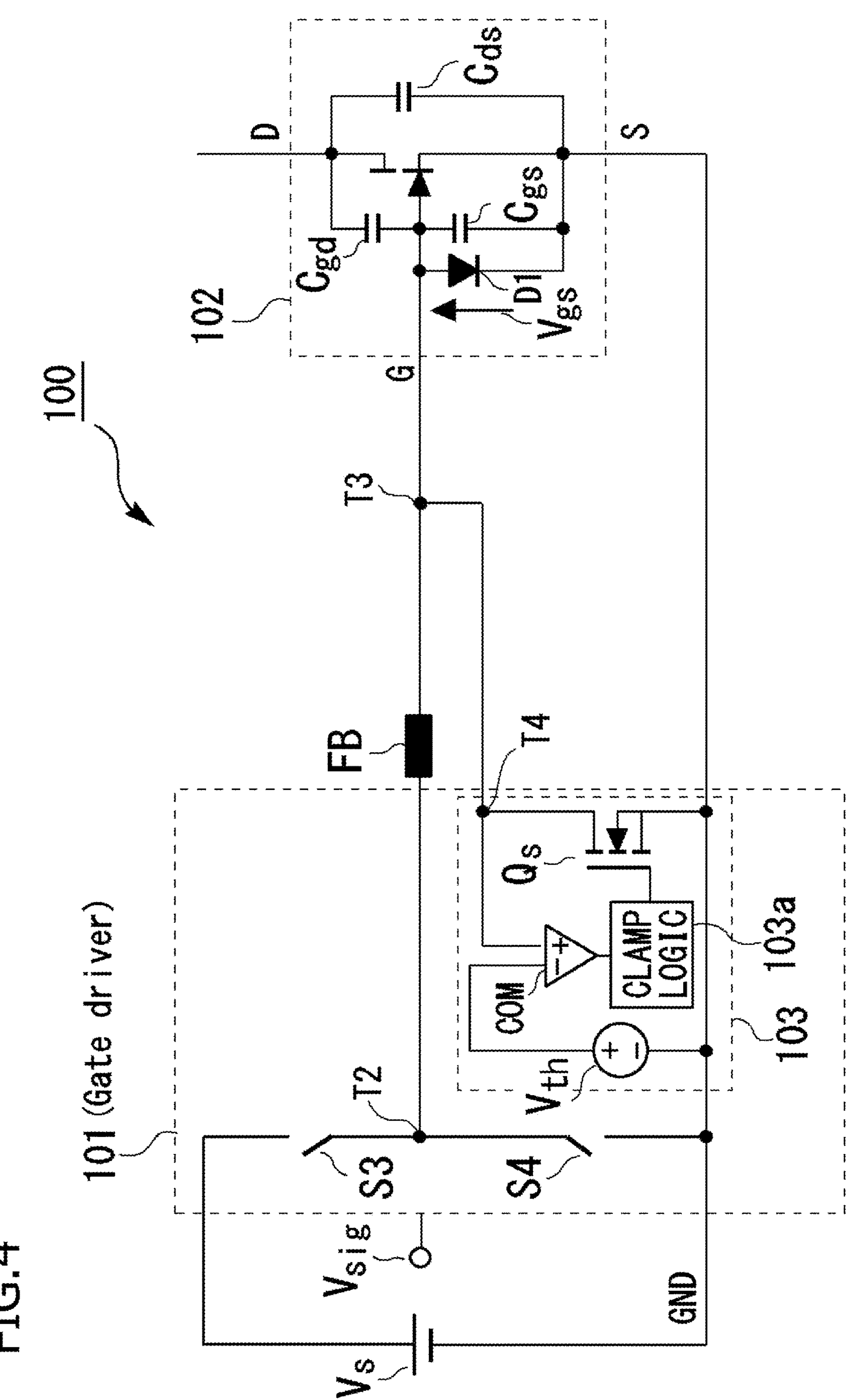
FIG. 4 is a circuit diagram illustrating a circuit configuration of a switching circuit according to an example of the present invention.

FIG. 4 is a circuit diagram illustrating a circuit configuration of a switching circuit 100 according to an application example of the present invention. The switching circuit 100 according to the application example includes a gate driver 101 including a mirror clamp circuit 103 that suppresses mirror noise, a ferrite bead FB that suppresses oscillation noise, and a semiconductor device 102. The mirror clamp circuit 103 is a circuit that bypasses a current due to a charge charged in a parasitic capacitance (capacitors Cgd, Cgs, and Cds) to a source terminal side and suppresses the increase in a gate potential due to the mirror noise. In the switching circuit 100 according to the application example, a connection point T4 of the mirror clamp circuit 103 is configured to be connected to a connection point T3 connected to a gate terminal G of the semiconductor device 102. The ferrite bead FB in the switching circuit 100 according to the application example is configured to be provided immediately near the gate driver 101 on a path between a connection point T2 of the gate driver 101 and the connection point T3 to which the mirror clamp circuit 103 is connected. That is, one end of the ferrite bead FB is connected to the connection point T2 of the gate driver 101, and the other end is connected to the connection point T3.

As illustrated in FIGS. 5 to 9, the switching circuit 100 according to the application example can separate a closed loop of a propagation path through which the oscillation noise propagates via a GND potential and a closed loop of a propagation path of the mirror noise accompanying the turn-on and turn-off of the semiconductor device 102. Then, the ferrite bead FB can be disposed in the propagation path through which the oscillation noise propagates, and the mirror clamp 103 that suppresses the mirror noise can be disposed without interposing the ferrite bead FB in the propagation path through which the mirror noise propagates.

Example 1

Hereinafter, a specific embodiment of the present invention will be described in more detail with reference to the drawings. Note that the configuration of the embodiment described below is an example, and the disclosed technology is not limited to the configuration of the embodiment.

<Circuit Configuration>

Figure 1A:
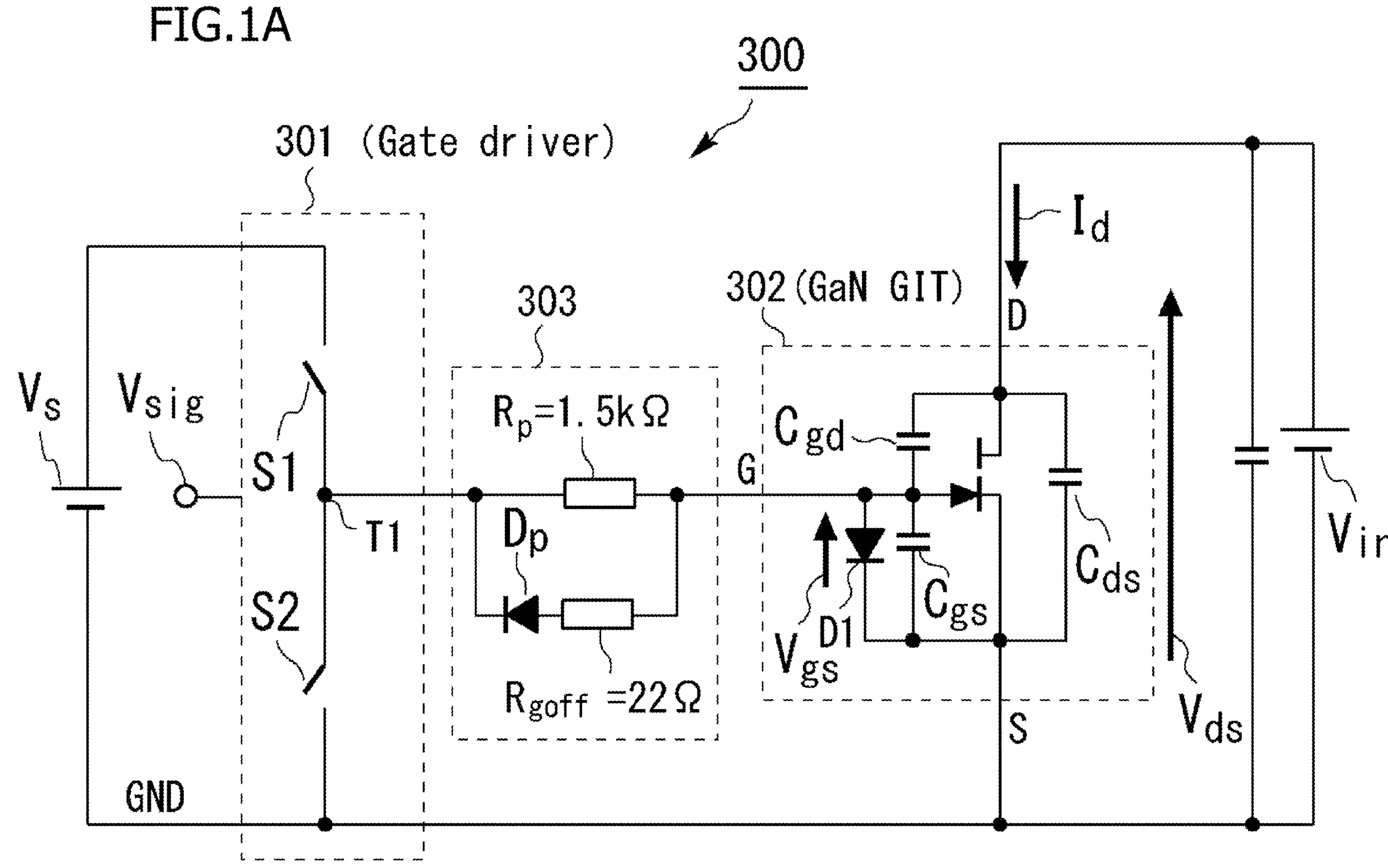
FIGS. 1A and 1B are circuit diagrams for explaining oscillation of a switching circuit as a premise of the present invention.
Figure 1B:
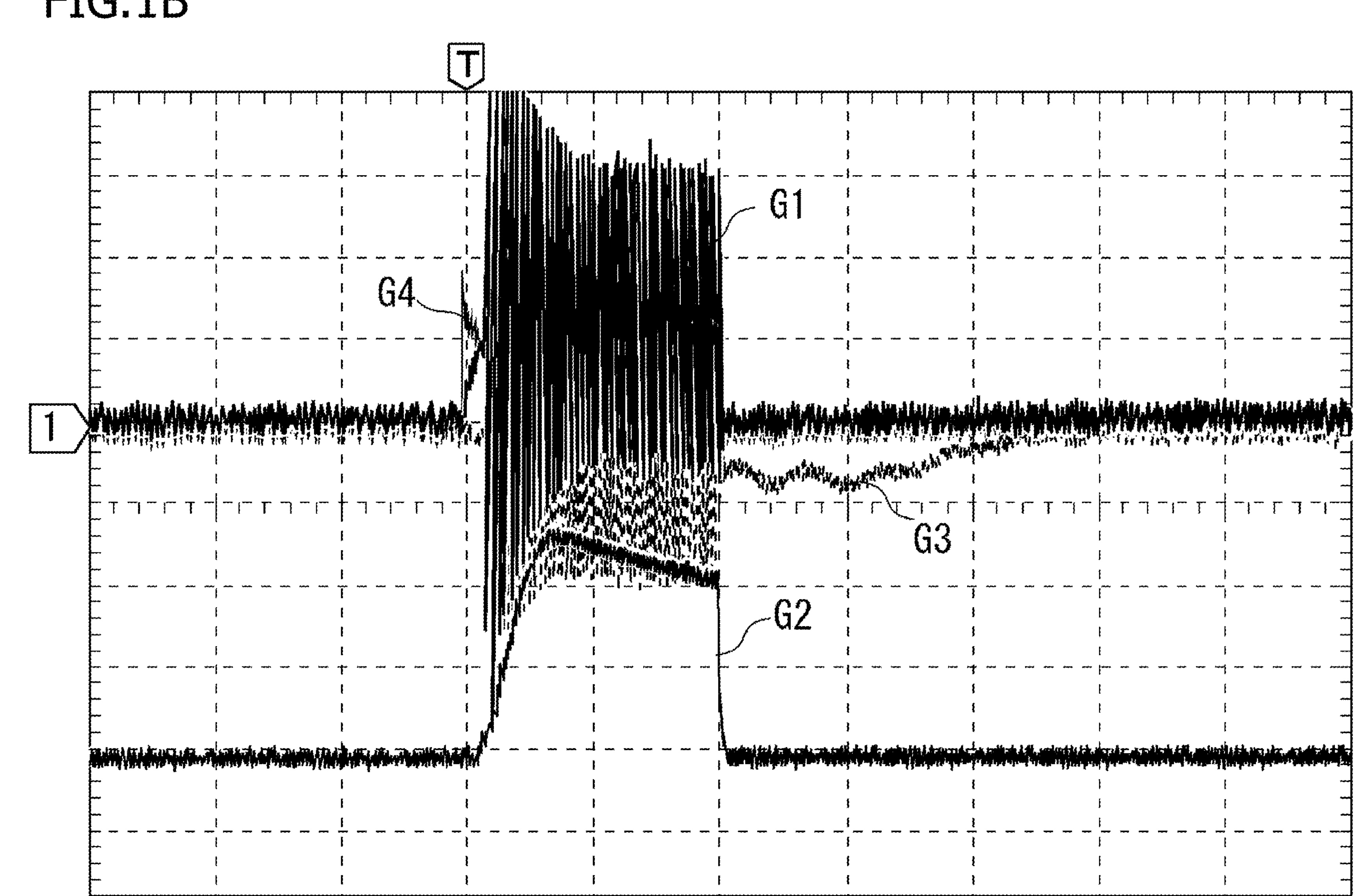

FIGS. 1A and 1B are diagrams for explaining oscillation of a switching circuit according to a premise of an example of the present invention. FIG. 1A illustrates a switching circuit 300 for oscillation evaluation including a circuit configuration (gate driver 301, semiconductor device 302) to be subjected to oscillation suppression according to the example, and FIG. 1B illustrates a situation of oscillation measured by the switching circuit 300. Note that a circuit configuration of the switching circuit 300 to be subjected to oscillation suppression according to the example constitutes, for example, a power converter such as a power conditioner (PCS) in a distributed power supply system operated in conjunction with a commercial power system. In the power converter, for example, power conversion processing for converting DC power stored in a storage battery unit or DC power generated by solar power generation into AC power synchronized with a commercial power system, and power conversion processing for converting AC power supplied from the power system or the like into DC power are performed.

As illustrated in FIG. 1A, the switching circuit 300 for oscillation evaluation includes a gate driver 301, a semiconductor device 302, and a gate resistance adjustment circuit 303. The gate driver 301 includes a switch element S1 having one end connected to a positive electrode side of a control power supply Vs and a switch element S2 having one end connected to a negative electrode side (GND) of the control power supply Vs, and the other end of the switch element S1 and the other end of the switch element S2 are connected via a connection point T1. The gate driver 301 opens and closes the switch elements S1 and S2 according to a control signal Vsig such as PWM, and generates a gate voltage Vgs for driving the semiconductor device based on a voltage applied from the control power supply Vs. The gate voltage Vgs generated by the gate driver 301 is applied between a gate terminal G and a source terminal S of the semiconductor device 302 via the connection point T1 and the GND.

The semiconductor device 302 is a switching device such as an insulated gate bipolar transistor (IGBT) or a wide bandgap semiconductor (silicon carbide (SiC) semiconductor, gallium nitride (GaN) semiconductor) capable of high-power high-speed switching. In the example, a gate injection transistor (GIT) using a GaN semiconductor is described as the semiconductor device 302, but the semiconductor device 302 may be, for example, a field effect transistor (FET) using a nitride semiconductor or a metal-oxide-semiconductor field-effect transistor (MOSFET) using silicon carbide.

The semiconductor device 302 conducts (turns on) and opens (turns off) between a drain terminal D and the source terminal S according to the gate voltage Vgs applied between the gate terminal G and the source terminal S. For example, the semiconductor device 302 conducts the drain terminal D-source terminal S when the gate voltage Vgs is in a high status exceeding a predetermined threshold, and opens the drain terminal D-source terminal S when the gate voltage Vgs is in a low status lower than or equal to the predetermined threshold. In the semiconductor device 302, a drain current Id flowing between the drain terminal D and the source terminal S is controlled according to the status of the gate voltage Vgs.

Note that, in FIG. 1A, a diode D1 connected between the gate terminal G and the source terminal S is a parasitic diode of the semiconductor device, and an anode of the diode D1 is connected to the gate terminal G, and a cathode of the diode D1 is connected to the source terminal S. Furthermore, the capacitors Cgd, Cgs, and Cds represent parasitic capacitance between the gate terminal G and the drain terminal D, parasitic capacitance between the gate terminal G and the source terminal S, and parasitic capacitance between the drain terminal D and the source terminal S, respectively. These parasitic capacitances cause oscillation noise of the semiconductor device 302.

The gate resistance adjustment circuit 303 includes a resistor Rp, a resistor Rgoff, and a diode Dp. The resistor Rgoff and the diode Dp connected in series are connected in parallel to the resistor Rp. An input end of the gate resistance adjustment circuit 303 to which a cathode of the diode Dp and one end of the resistor Rp are connected is connected to the connection point T1 of the gate driver 301. Furthermore, an output end of the gate resistance adjustment circuit 303 in which the other end of the resistor Rgoff having one end connected to an anode of the diode Dp and the other end of the resistor Rp are connected is connected to the gate terminal G of the semiconductor device 302.

In the switching circuit 300 for oscillation evaluation, a resistance value of the resistor Rp was set to 1.5 kΩ and a resistance value of the resistor Rgoff was set to 22Ω, so that a resistance value (gate resistor value) in a path to which the gate voltage Vgs between the gate driver 301 and the semiconductor device 302 was applied was adjusted to 1.5 kΩ to evaluate the oscillation of the semiconductor device 302. Note that, in the oscillation evaluation, a positive electrode side of an evaluation power supply Vin was connected to the drain terminal D of the semiconductor device 302, a negative electrode side of the evaluation power supply Vin was connected to the source terminal S, and a voltage of 100 VDC was applied between the drain terminal D and the source terminal S. Then, a pulse width of an evaluation signal applied from the gate driver 301 to the gate terminal G of the semiconductor device 302 was set to a single pulse of 2 μsec, and a current fluctuation and a voltage fluctuation relating to the switching operation were measured. In the example, as the current fluctuation and the voltage fluctuation related to the switching operation, the gate voltage Vgs of the semiconductor device 302, a voltage (inter-terminal voltage) Vds applied between the drain terminal D and the source terminal S, the drain current Ids, and a gate current Ig are measured.

In FIG. 1B, the vertical axis represents a relative magnitude of the measured current fluctuation and voltage fluctuation, and the horizontal axis represents time. Furthermore, a graph G1 represents the transition of the gate voltage Vgs, a graph G2 represents the transition of the drain current Ids, a graph G3 represents the transition of the inter-terminal voltage Vds, and a graph G4 represents the transition of the gate current Ig. T surrounded by a rectangular frame represents a rise of the evaluation signal applied to the gate terminal G. As illustrated in FIG. 1B, it can be seen that the gate current Ig illustrated in the graph G4 sharply rises with the rise of the evaluation signal and flows between the gate terminal G of the semiconductor device 302 and the GND. Then, as illustrated in the graphs G1 and G2, it can be seen that, when the gate voltage Vgs exceeds the predetermined threshold value, the semiconductor device 302 is turned on, and the drain current Ids flows between the drain terminal D and the source terminal S. Then, as illustrated in the graph G1, it can be seen that the high-frequency oscillation noise caused by the parasitic capacitance is superimposed with the turn-on of the semiconductor device 302 as a trigger, and the gate voltage Vgs fluctuates greatly. It can be seen that the fluctuation range of the gate voltage Vgs largely fluctuates relatively to the negative side from the potential state (rectangular frame 1) before the evaluation signal is input.

Figure 2A:
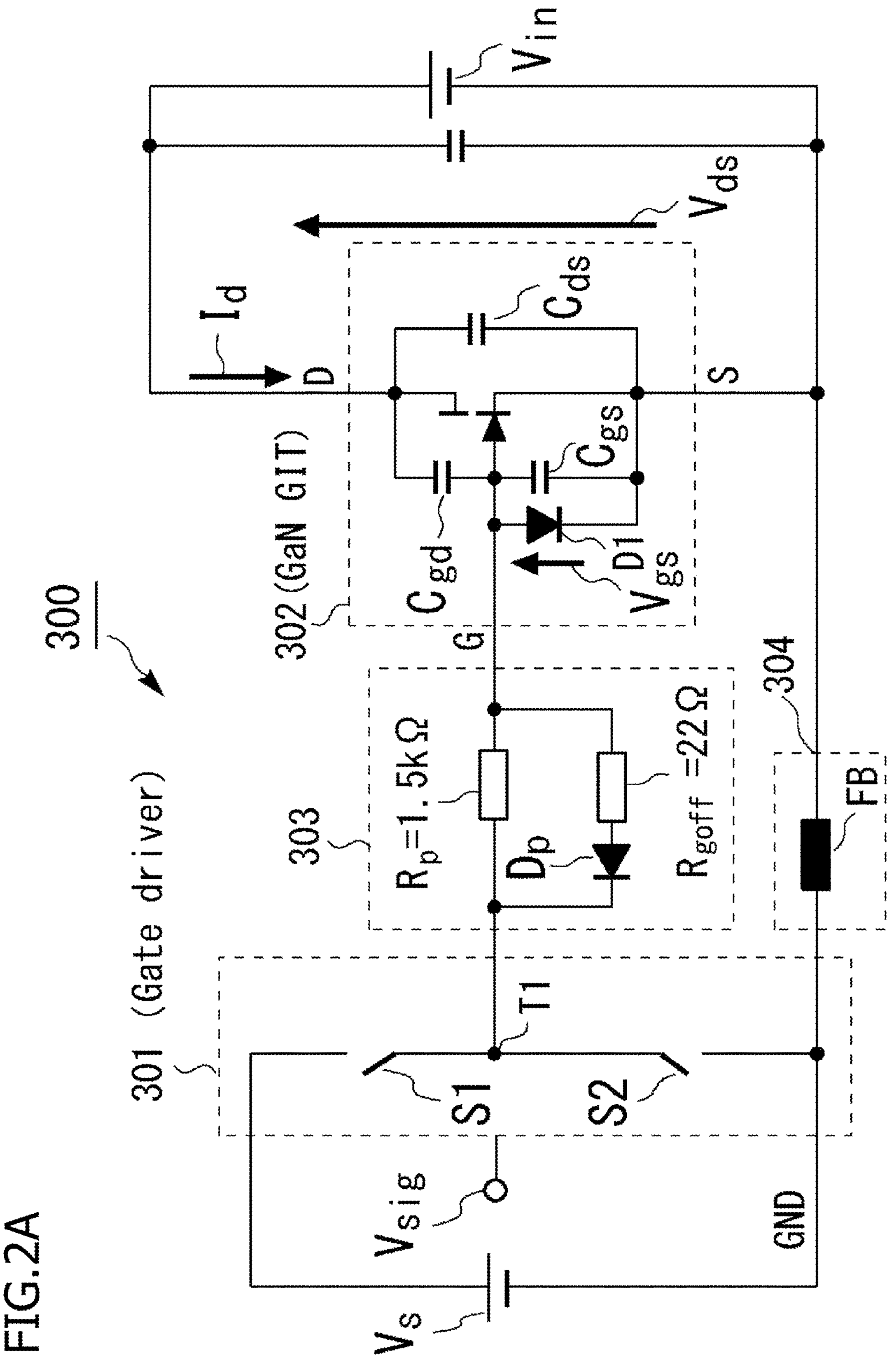
FIGS. 2A and 2B are diagrams for explaining suppression of oscillation noise by a ferrite bead of a switching circuit as a premise of the present invention.
Figure 2B:
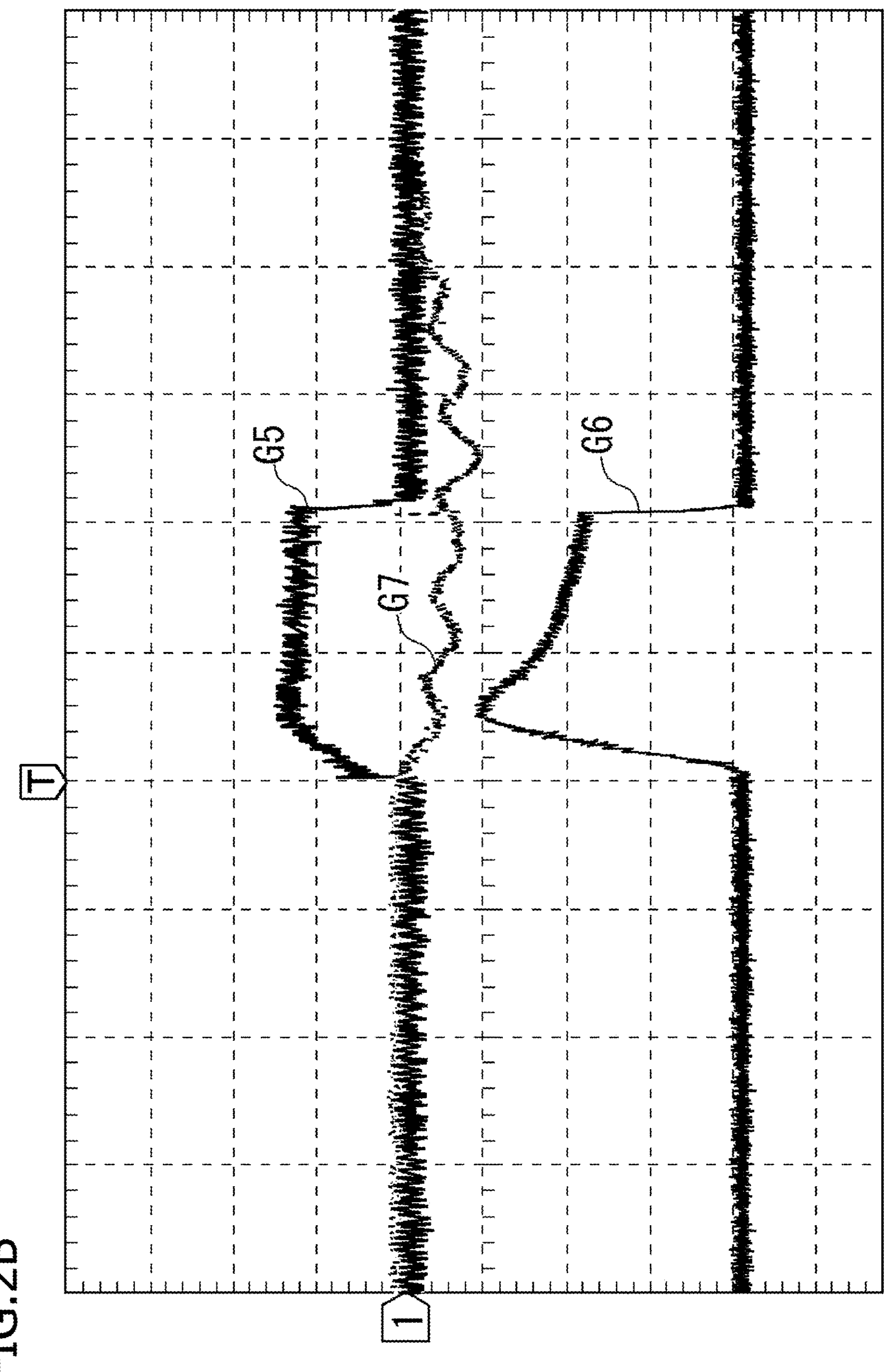

FIGS. 2A and 2B are diagrams for explaining suppression of oscillation noise using a ferrite bead. FIG. 2A illustrates the switching circuit 300 for evaluation including a ferrite bead FB. The mode illustrated in FIG. 2A is a mode in which the ferrite bead FB is inserted into a path on a GND potential side where the source terminal S of the semiconductor device 302 and the switch element S2 of the gate driver 301 are connected, with respect to the circuit configuration of FIG. 1A, as indicated by a broken rectangular frame 304. That is, one end of the ferrite bead FB is connected to a connection point on the GND side of the switch element S2 of the gate driver 301, and the other end is connected to the source terminal S of the semiconductor device 302. The ferrite bead FB functions as an inductor that increases impedance in a high frequency range, thereby suppressing noise superimposed on the gate voltage Vgs, and suppressing steep fluctuation of the gate voltage applied between the gate terminal G and the source terminal S of the semiconductor device 302. In the example, the ferrite bead FB is described as an inductor for suppressing the oscillation noise, but such an inductor may be an inductor having a hollow cylindrical ferrite core structure, or may have an equivalent circuit configuration of the ferrite bead FB including an inductor L and a resistor R.

FIG. 2B illustrates an evaluation situation of oscillation in the switching circuit 300 including the ferrite bead FB in the path on the GND side. Note that the conditions related to the evaluation measurement are the same as those in FIG. 1B. In FIG. 2B, the vertical axis represents a relative magnitude of the measured current fluctuation and voltage fluctuation, and the horizontal axis represents time. Furthermore, T surrounded by a rectangular frame represents a rise of the evaluation signal applied to the gate terminal G. A graph G5 represents the transition of the gate voltage Vgs, a graph G6 represents the transition of the drain current Ids, and a graph G7 represents the transition of the inter-terminal voltage Vds. As illustrated in the graph G5, it can be seen that the gate voltage Vgs suppresses the high-frequency oscillation noise caused by the parasitic capacitance with the turn-on of the semiconductor device 302 as a trigger. It can be seen that the fluctuation range of the gate voltage Vgs transitions without swinging to the negative side with respect to the potential state (rectangular frame 1) before the evaluation signal is input.

As described with reference to FIGS. 1A and 1B, and FIGS. 2A and 2B, in the switching circuit 300, it can be seen that it is effective to provide the ferrite bead FB as an inductor for increasing the impedance in order to suppress the oscillation noise in the high frequency range caused by the parasitic capacitance of the semiconductor device 302. However, due to the addition of the ferrite bead FB, the charge charged in the parasitic capacitance (capacitors Cgd, Cgs, and Cds) is amplified with the turn-on and turn-off of the semiconductor device 302, and noise (mirror noise) associated with the switching operation may increase. The increase in the mirror noise becomes remarkable with the increase in the switching speed, and for example, the voltage applied to the gate terminal is increased, which may cause malfunction of the semiconductor device or destruction (for example, arm breakage or the like) of other switching devices constituting a half bridge circuit or a full bridge circuit.

Figure 3:
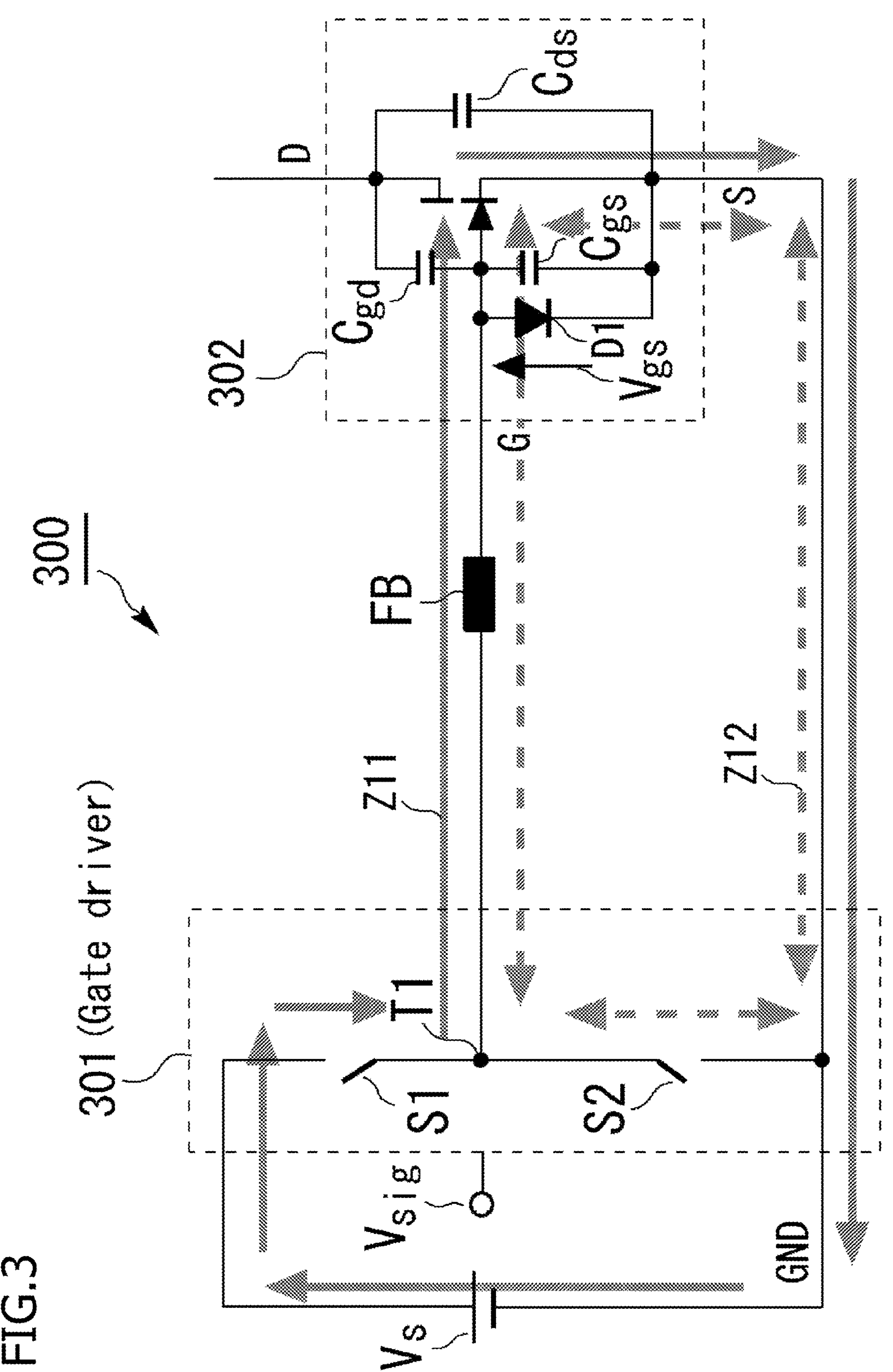
FIG. 3 is a diagram for explaining a propagation path of noise in a switching circuit as a premise of the present invention.

FIG. 3 is a diagram for explaining a propagation path of noise in the switching circuit 300. In FIG. 3, a path indicated by a thick line arrow Z11 represents a propagation path of the oscillation noise, and a path indicated by a thick broken line arrow Z12 represents a propagation path of the mirror noise. Note that, in the switching circuit 300 illustrated in FIG. 3, the ferrite bead FB is provided immediately near the gate terminal of a wiring path where the connection point T1 of the gate driver 301 and the gate terminal G of the semiconductor device 302 are connected.

As indicated by the thick line arrow Z11, the oscillation noise is propagated through the path of the GND potential between the gate driver 301 and the semiconductor device 302, and constitutes a closed loop of a propagation path including the control power supply Vs→the gate driver 301→the ferrite bead FB→the gate terminal G→the source terminal S→the control power supply Vs. In the closed loop indicated by the thick line arrow Z11, since the inductor by the ferrite bead FB functions to increase the impedance with respect to the oscillation noise, the oscillation noise is suppressed.

However, the mirror noise is caused by the parasitic capacitance (capacitors Cgd, Cgs, and Cds) of the semiconductor device 302, and a charge charged in the parasitic capacitance propagates as the semiconductor device 302 is turned on and off. Therefore, as indicated by the thick broken line arrow Z12, a closed loop of a propagation path of the mirror noise configured by the gate driver 301 (connection point T1)→the ferrite bead FB→the gate terminal G→the source terminal S→the gate driver 301 (GND-side switch element S2)→the gate driver 301 (connection point T1) is configured.

In the switching circuit 300 illustrated in FIG. 3, the mirror noise is bidirectionally propagated through the closed loop indicated by the thick broken line arrow Z12 as the semiconductor device 302 is turned on and off. Therefore, the charge charged in the parasitic capacitance (capacitors Cgd, Cgs, and Cds) is amplified via the inductor of the ferrite bead FB, and the mirror noise accompanying the turn-on and turn-off of the semiconductor device 302 increases.

Circuit Configuration of Example 1

FIG. 4 is a circuit diagram illustrating a circuit configuration of the switching circuit 100 according to the example. The switching circuit 100 according to the example includes a gate driver 101 including a mirror clamp circuit 103 that suppresses mirror noise, a ferrite bead FB that suppresses oscillation noise, and a semiconductor device 102. Here, the mirror clamp circuit 103 is a circuit that bypasses a current due to a charge charged in a parasitic capacitance (capacitors Cgd, Cgs, and Cds) to a source terminal side and suppresses the increase in the gate potential due to the mirror noise. In the switching circuit 100 according to the example, a connection point T4 of the mirror clamp circuit 103 is configured to be connected to a connection point T3 connected to a gate terminal G of the semiconductor device 102. Then, the ferrite bead FB in the switching circuit 100 according to the example is configured to be provided immediately near the gate driver 101 on a path between a connection point T2 of the gate driver 101 and the connection point T3 to which the mirror clamp circuit 103 is connected.

Note that, in the switching circuit 100 according to the example, the gate driver 101 corresponds to an example of a “drive circuit”, and the semiconductor device 102 corresponds to an example of a “switching device”. Similarly, the mirror clamp circuit 103 corresponds to an example of a “clamp circuit”, and the ferrite bead FB corresponds to an example of a “ferrite inductor”. Furthermore, the connection point T2 of the gate driver 101 according to the example corresponds to an example of an “output end”, and the connection point T3 to which the other end of the ferrite bead FB is connected corresponds to an example of a "connection point".

The switching circuit 100 according to the example can separate the closed loop of the propagation path through which the oscillation noise propagates via the GND potential and the closed loop of the propagation path of the mirror noise accompanying the turn-on and turn-off of the semiconductor device 102 by the circuit configuration illustrated in FIG. 4. According to the switching circuit 100 of the example, it is possible to suppress the oscillation noise propagated via the GND potential by the inductor of the ferrite bead FB and to suppress the mirror noise propagated by the mirror clamp circuit 103 connected via the connection point T3.

Figure 5A:
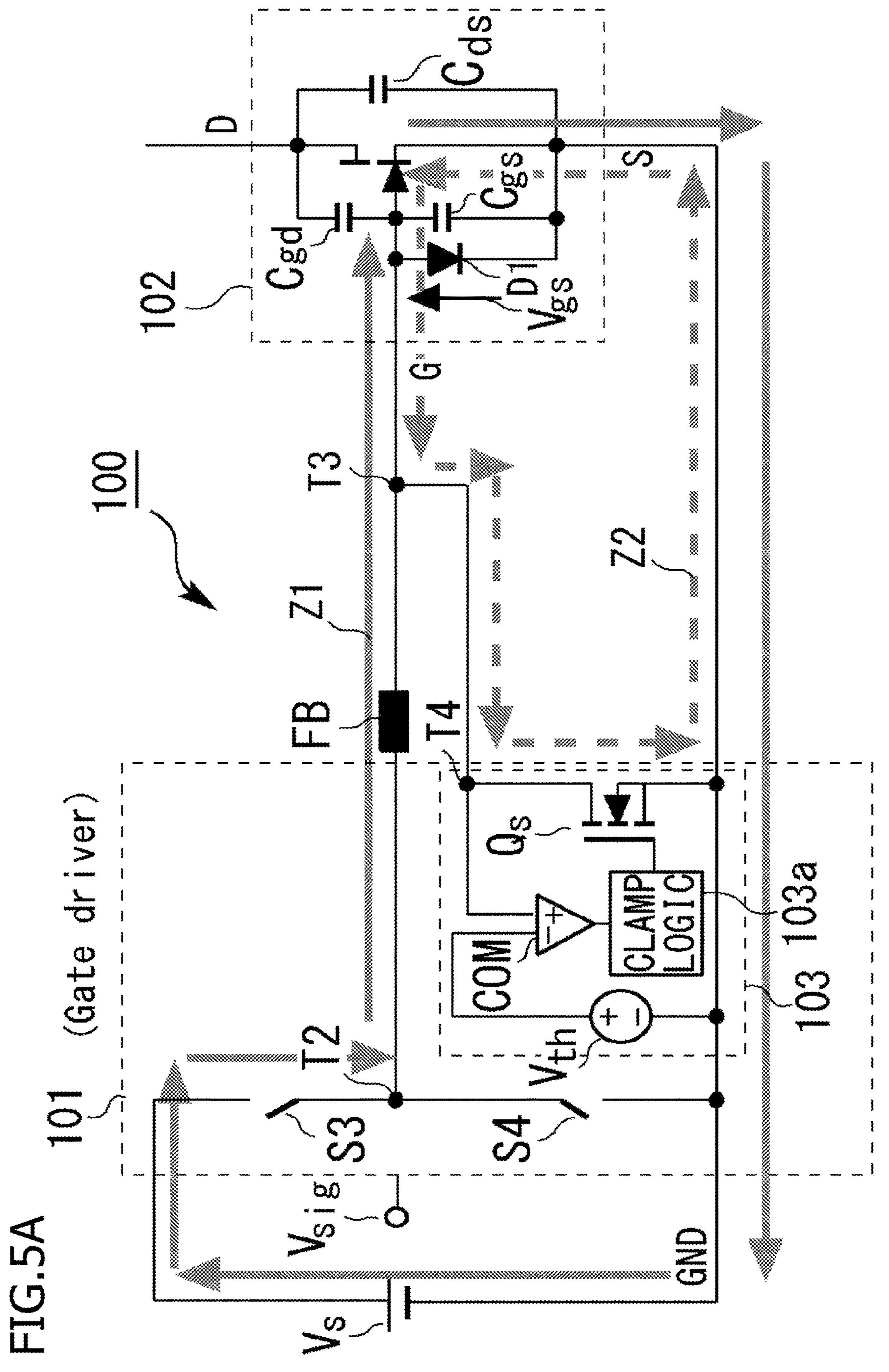
FIGS. 5A to 5C are diagrams for explaining a propagation path of noise in a switching circuit according to an example of the present invention.
Figure 5B:
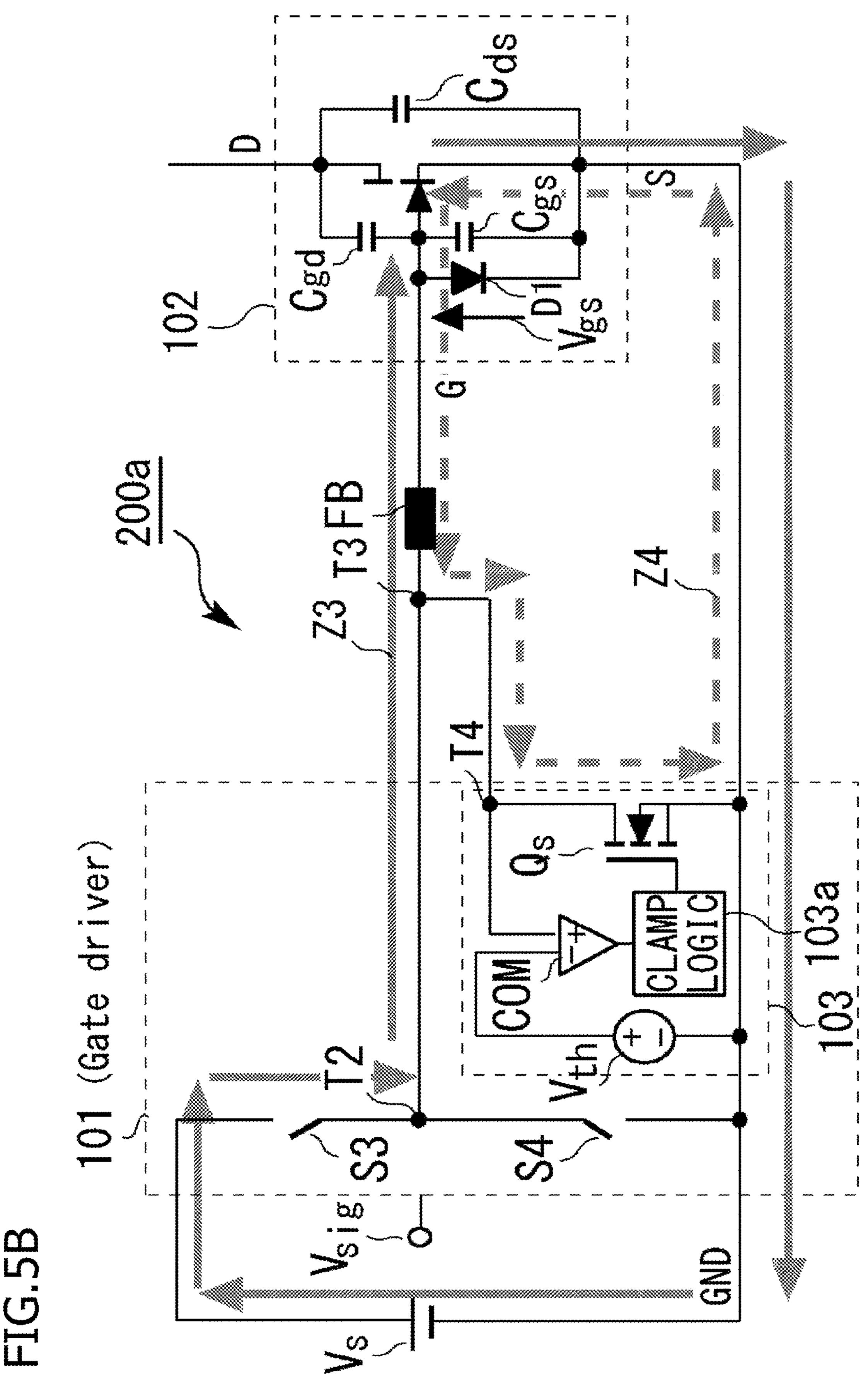
Figure 5C:
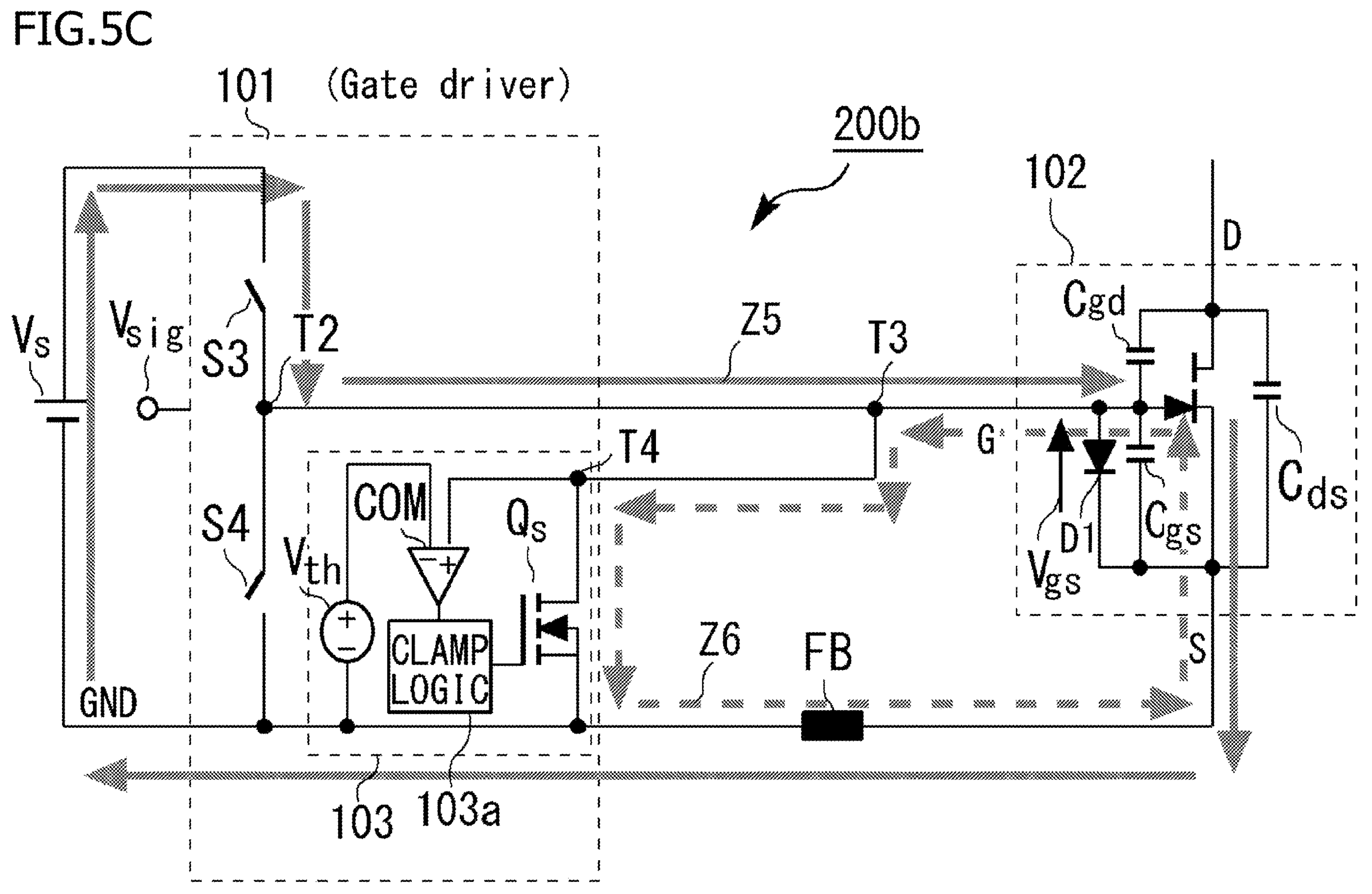

FIGS. 5A to 5C are diagrams for explaining a propagation path of noise in the switching circuit 100 according to the example. FIG. 5A illustrates a diagram for explaining a propagation path of the switching circuit 100, and FIGS. 5B and 5C illustrate diagrams for explaining propagation paths in switching circuits 200*a* and 200*b* having different arrangement positions of the ferrite beads FB. In FIGS. 5A, 5B, and 5C, each thick line arrow (Z1, Z3, Z5) represents a propagation path of oscillation noise in each switching circuit, and each thick broken line arrow (Z2, Z4, Z6) represents a propagation path of mirror noise in each switching circuit.

In the switching circuit 100 according to the example, as indicated by the thick line arrow Z1, the oscillation noise is propagated through a path of the GND potential between the gate driver 101 and the semiconductor device 102, and a closed loop of a propagation path including the control power supply Vs→the gate driver 101 (connection point T2)→the ferrite bead FB→the connection point T3→the gate terminal G→the source terminal S→the control power supply Vs is configured. As indicated by the thick broken line arrow Z2, the propagation path of the mirror noise is a closed loop including the gate terminal G→the connection point T3→the connection point T4→the mirror clamp circuit 103→the source terminal S→the gate terminal G. In the switching circuit 100 according to the example, the ferrite bead FB does not exist in the closed loop path through which the mirror noise propagates. Therefore, in the semiconductor device 102, the charge charged in the parasitic capacitance (capacitors Cgd, Cgs, and Cds) is not amplified via the inductor of the ferrite bead FB as in the semiconductor device 302 illustrated in FIG. 3. In the switching circuit 100, it is possible to achieve both suppression of the oscillation noise and suppression of the mirror noise.

In the switching circuit 200*a* in FIG. 5B, the ferrite bead FB for suppressing the oscillation noise is provided on a wiring path between the connection point T3 and the gate terminal G. In the switching circuit 200*a*, as indicated by the thick line arrow Z3, the oscillation noise is propagated through a path of the GND potential between the gate driver 101 and the semiconductor device 102, and a closed loop of a propagation path including the control power supply Vs→the gate driver 101 (connection point T2)→the ferrite bead FB→the gate terminal G→the source terminal S→the control power supply Vs is configured. However, as indicated by the thick broken line arrow Z4, the propagation path of the mirror noise is a closed loop including the gate terminal G→the ferrite bead FB→the connection point T3→the connection point T4→the mirror clamp circuit 103→the source terminal S→the gate terminal G, and the ferrite bead FB is included in the path of the closed loop through which the mirror noise propagates. Therefore, in a case where the ferrite bead FB is provided on the path between the connection point T3 and the gate terminal G, although the noise suppression effect by the mirror clamp circuit 103 can be obtained to some extent, the charge charged in the parasitic capacitance (capacitors Cgd, Cgs, and Cds) of the semiconductor device 102 is amplified via the inductor of the ferrite bead FB, and a sufficient suppression effect cannot be obtained.

In the switching circuit 200*b* in FIG. 5C, the ferrite bead FB for suppressing the oscillation noise is provided on a path between the GND potential side of the mirror clamp circuit 103 and the source terminal S. In the switching circuit 200*b*, as indicated by the thick line arrow Z5, the oscillation noise is propagated through a path of the GND potential between the gate driver 101 and the semiconductor device 102, and a closed loop propagation path including the control power supply Vs→the gate driver 101 (connection point T2)→the gate terminal G→the source terminal S→the ferrite bead FB→the control power supply Vs is configured. However, as indicated by the thick broken line arrow Z6, the propagation path of the mirror noise is a closed loop including the gate terminal G→the connection point T3→the connection point T4→the mirror clamp circuit 103→the ferrite bead FB→the source terminal S→the gate terminal G, and the ferrite bead FB is included in the path of the closed loop through which the mirror noise propagates. Therefore, also in the switching circuit 200*b*, although the noise suppression effect by the mirror clamp circuit 103 can be obtained to some extent, the charge charged in the parasitic capacitance (capacitors Cgd, Cgs, and Cds) of the semiconductor device 102 is amplified via the inductor of the ferrite bead FB, and a sufficient suppression effect cannot be expected.

Returning to FIG. 4, the gate driver 101 includes a switch element S3 having one end connected to a positive electrode side of the control power supply Vs and a switch element S4 having one end connected to a negative electrode side (GND) of the control power supply Vs, and the other end of the switch element S3 and the other end of the switch element S4 are connected via the connection point T2. The gate driver 101 opens and closes the switch elements S3 and S4 according to a control signal Vsig such as PWM, and generates a gate voltage Vgs for driving the semiconductor device based on a voltage applied from the control power supply Vs. The gate voltage Vgs generated by the gate driver 101 is applied between the gate terminal G and the source terminal S of the semiconductor device 102 via the ferrite bead FB having one end connected to the connection point T2 and the GND. In the example, the switch element S3 corresponds to an example of a "first switch element", and the switch element S4 corresponds to an example of a "second switch element". Note that, since the semiconductor device 102 is a switching device having a circuit configuration similar to that of the semiconductor device 302, the description thereof is omitted.

The mirror clamp circuit 103 includes an internal reference potential Vth, a comparator COM, a clamp logic 103*a*, and a transistor Qs that is an N-type MOSFET. Note that the mirror clamp circuit 103 may be provided outside the gate driver 101. Furthermore, the transistor Qs may be replaced with another switch such as a P-type MOSFET.

In the mirror clamp circuit 103, the internal reference potential Vth is input to an inverting input terminal (−) of the comparator COM as a signal source. Furthermore, the gate voltage Vgs propagated through the connection point T4 is input to a non-inverting input terminal (+) of the comparator COM. The comparator COM compares the internal reference potential Vth input to the inverting input terminal (−)

with the gate voltage Vgs input to the non-inverting input terminal (+), and outputs a comparison result to the clamp logic 103*a*. The clamp logic 103*a* controls a gate voltage of the transistor Qs on the basis of the comparison result output from the comparator COM, and controls conduction or openness between the drain and the source. The connection point T4 is connected to the drain of the transistor Qs, and the GND potential is connected to the source. In the mirror clamp circuit 103, for example, the gate voltage is controlled such that the drain and the source of the transistor Qs are conducted at the timing when the switch element S4 is in an on state (closed state). As a result, the mirror noise due to turn-on and turn-off caused by the charge charged in the parasitic capacitance (capacitors Cgd, Cgs, and Cds) of the semiconductor device 102 is suppressed. In the mirror clamp circuit 103 according to the example, the GND potential corresponds to an example of a "reference potential", and the internal reference potential Vth corresponds to an example of a "threshold potential". Similarly, the transistor Qs of the mirror clamp circuit 103 corresponds to an example of a "third switch element that conducts between the reference potential of the drive circuit and the connection point".

<Suppression Evaluation of Mirror Noise>

Next, a result of a mirror noise suppression evaluation test using the switching circuit 100 according to the example will be described with reference to FIGS. 6A and 6B to FIGS. 9A and 9B. In the evaluation test, in order to perform relative evaluation, a comparative evaluation test was performed on a mode in which a switching circuit 200*b* illustrated in FIG. 5C, that is, the ferrite bead FB for suppressing the oscillation noise was provided on a path between the GND potential side of the mirror clamp circuit 103 and the source terminal S. As evaluation conditions, an input voltage applied between the drain terminal D and the source terminal S of the semiconductor device 102 was set to 50 V, an output voltage generated by a switching operation (turn-on, turn-off) of the semiconductor device 102 was set to 90 V, and a switching frequency was set to 50 kHz, and a voltage fluctuation due to the mirror noise caused by the turn-on and turn-off was measured. In the example, the voltage (inter-terminal voltage) Vds applied between the drain terminal D and the source terminal S and the gate voltage Vgs are measured as the voltage fluctuation due to the mirror noise.

Figure 6A:
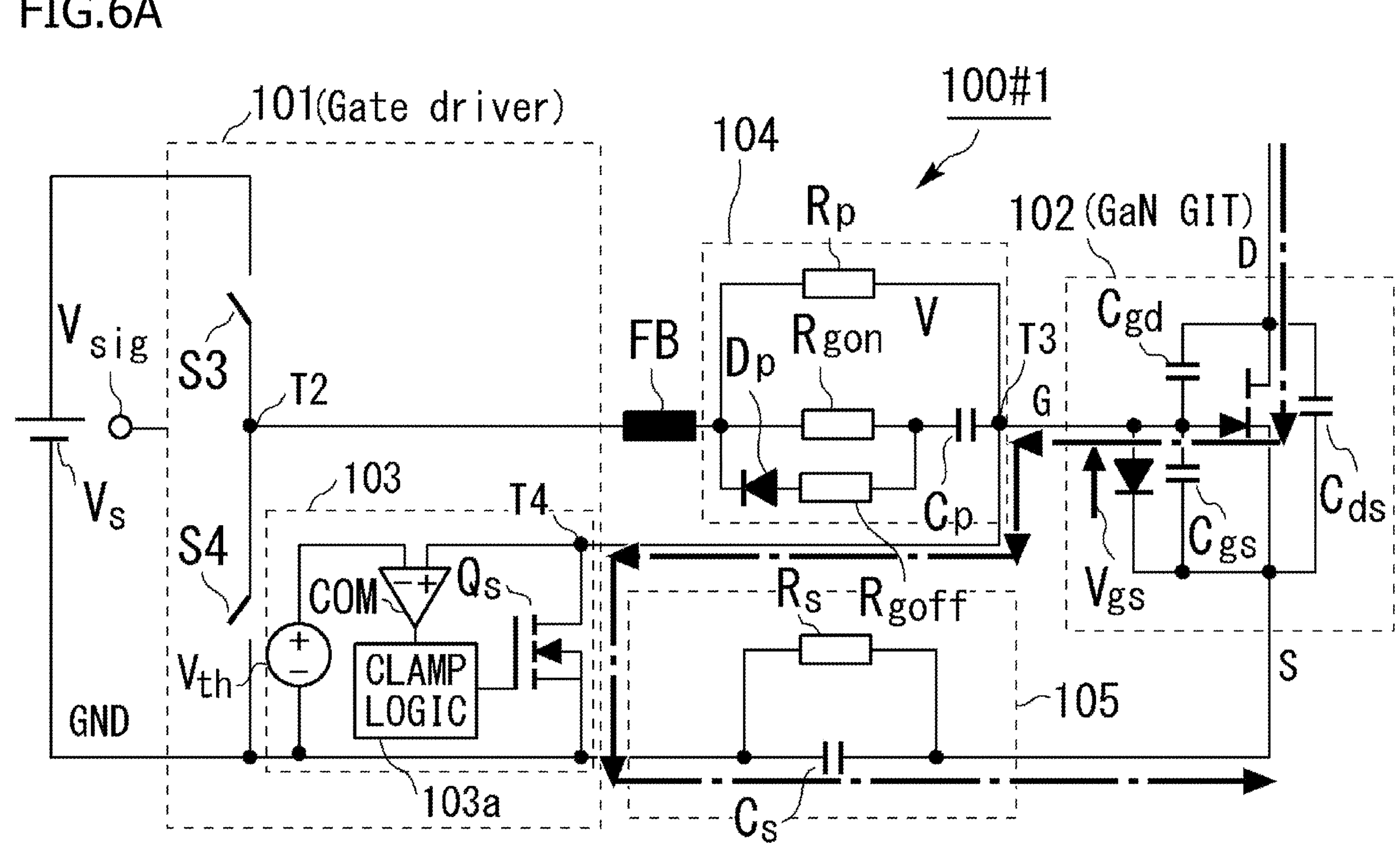
FIGS. 6A and 6B are diagrams illustrating a result of an evaluation test of mirror noise suppression at the time of turn-on of the switching circuit according to the example of the present invention.
Figure 6B:
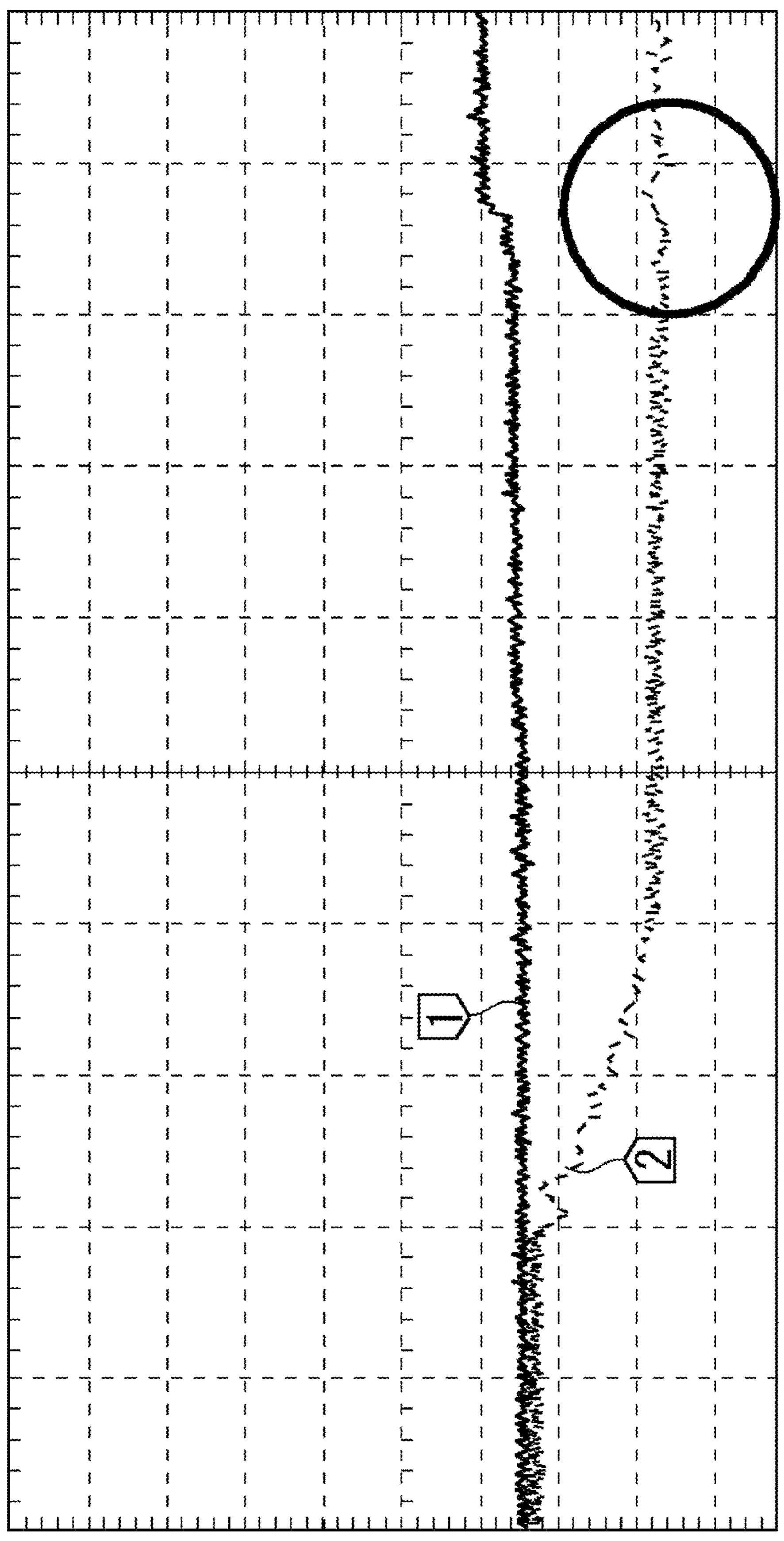

First, a test result at the time of turn-on will be described. FIGS. 6A and 6B are diagrams illustrating a result of the evaluation test at the time of turn-on by the switching circuit 100 according to the example. FIG. 6A illustrates a circuit configuration of a switching circuit 100 #1, and FIG. 6B illustrates a state of mirror noise with respect to the inter-terminal voltage Vds and the gate voltage Vgs measured under the above-described evaluation conditions.

In FIG. 6A, the circuits 104 and 105 are gate resistance adjustment circuits. The circuit 104 includes resistors Rp, Rgon, and Rgoff, a capacitor Cp, and a diode Dp, and is provided between the ferrite bead FB provided immediately near the gate driver 101 and the gate terminal G of the semiconductor device 102. The circuit 105 includes a resistor Rs and a capacitor Cs, and is provided in a GND potential path between the source terminal S of the semiconductor device 102 and the gate driver 101. Note that, in FIG. 6A, an alternate long and short dash line arrow indicates a propagation path of the mirror noise propagated through the drain terminal D and the gate terminal G when the semiconductor device 102 is turned on.

In FIG. 6B, the vertical axis represents a relative magnitude of the measured voltage fluctuation, and the horizontal axis represents time. Furthermore, a graph indicated by a rectangular frame 1 represents transition of a voltage (inter-terminal voltage) Vds applied between the drain terminal D and the source terminal S when the semiconductor device is turned on, and similarly, a graph indicated by a rectangular frame 2 represents transition of the gate voltage Vgs.

A transition of the gate voltage Vgs due to the mirror noise is illustrated in a region surrounded by a thick line in FIG. 6B. As indicated by the transition of the gate voltage Vgs in the thick line circle, it can be seen that the voltage fluctuation range due to the mirror noise is minimized. In the switching circuit 100 in the example, the ferrite bead FB is provided immediately near the output end (connection point T2) of the gate driver 101, and the connection point T3 on a connection path between the ferrite bead FB and the gate terminal G and the connection point T4 of the mirror clamp circuit 103 are connected. Then, the mirror noise propagated via the connection point T3 is propagated to the GND potential to which the source terminal S of the semiconductor device 102 is connected via the transistor Qs of the mirror clamp circuit 103 provided in the gate driver 101. Since the ferrite bead FB does not exist in the path (dashed-dotted line arrow) through which the mirror noise propagates, the suppression effect by the mirror clamp circuit 103 can be exhibited. As indicated by the thick line circle in FIG. 6B, since the influence of the mirror noise on the gate voltage Vgs (fluctuation range of the gate voltage) is suppressed to the minimum, it is possible to prevent malfunction or the like due to an increase in the gate voltage Vgs.

Figure 7A:
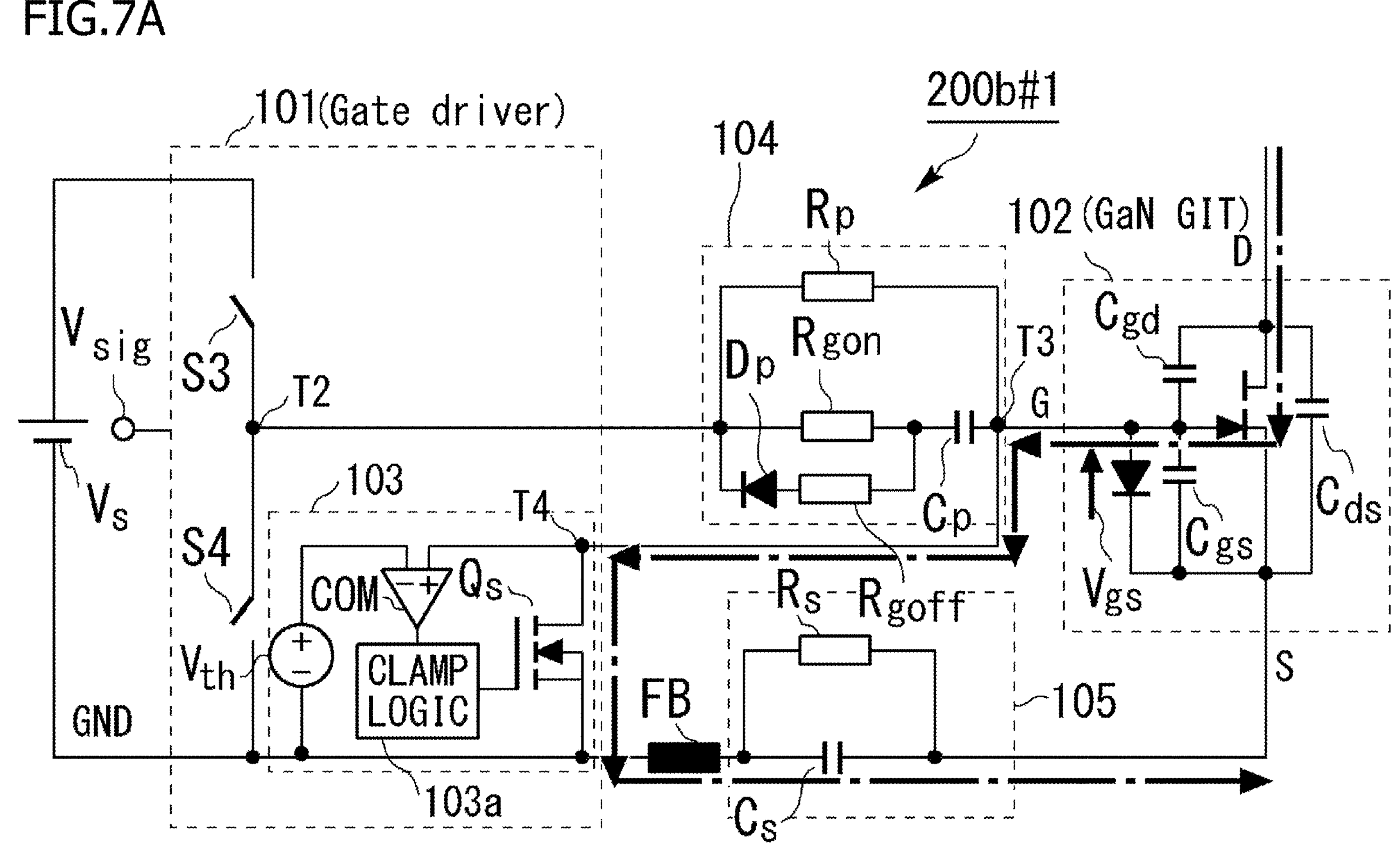
FIGS. 7A and 7B are diagrams illustrating a result of an evaluation test of mirror noise suppression at the time of turn-on of a switching circuit according to a comparative mode of the present invention.
Figure 7B:
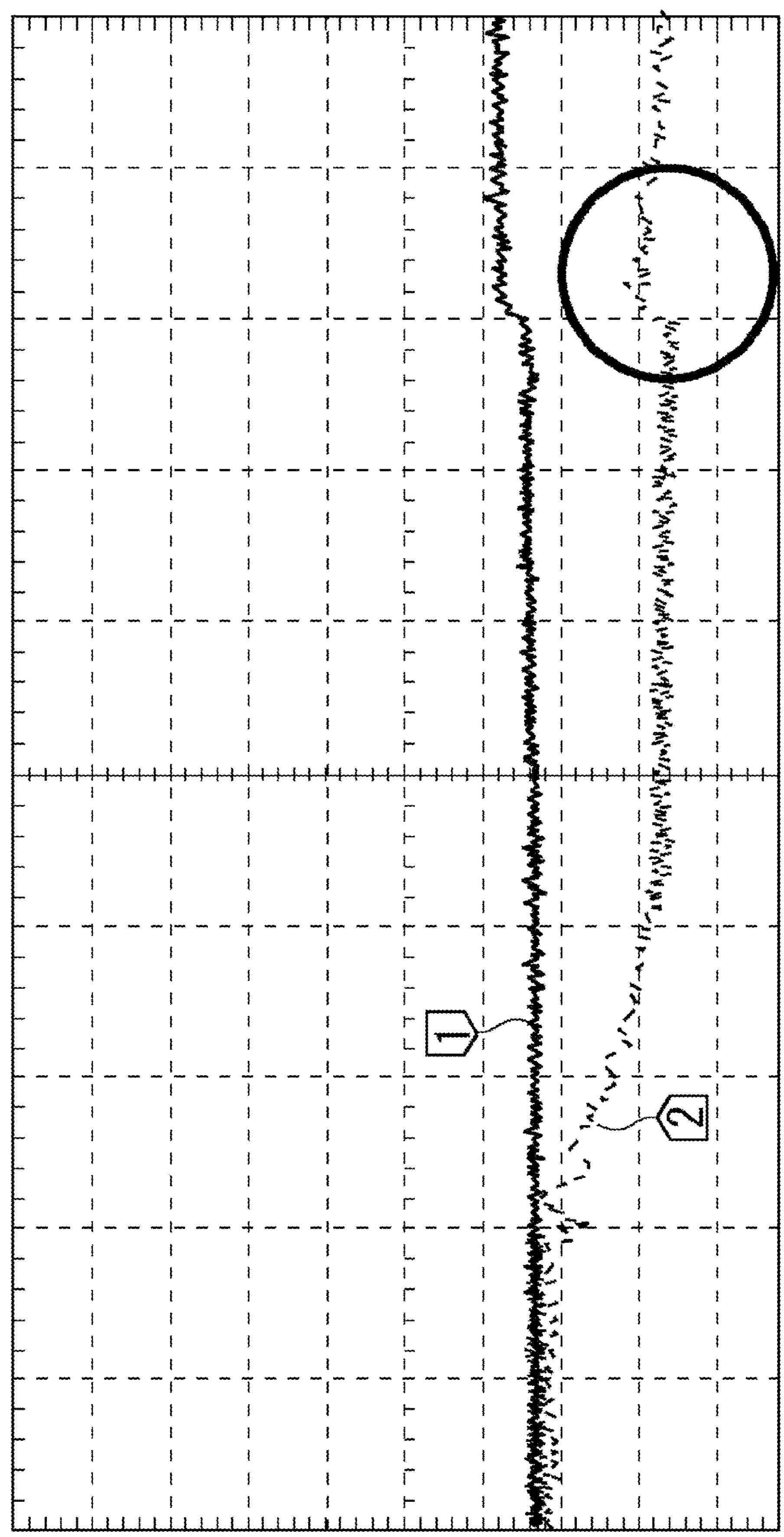

FIGS. 7A and 7B are diagrams for explaining a result of the evaluation test at the time of turn-on by the switching circuit 200*b*. FIG. 7A illustrates a circuit configuration of a switching circuit 200*b* #1, and FIG. 7B illustrates a state of mirror noise with respect to the inter-terminal voltage Vds and the gate voltage Vgs measured under the above-described evaluation conditions. Note that the circuits 104 and 105 provided in the switching circuit 200*b* #1 are similar to the circuits 104 and 105 of the switching circuit 100 #1. The circuit 105 is provided in a path of the GND potential between the ferrite bead FB and the source terminal S of the semiconductor device 102. An alternate long and short dash line arrow in FIG. 7A represents a propagation path of the mirror noise propagated through the drain terminal D and the gate terminal G when the semiconductor device 102 is turned on, a vertical axis in FIG. 7B represents a relative magnitude of the measured voltage fluctuation, and a horizontal axis represents time. Similarly to FIG. 6B, a graph indicated by a rectangular frame 1 represents the transition of the voltage (inter-terminal voltage) Vds applied between the drain terminal D and the source terminal S when the semiconductor device is turned on, and a graph indicated by a rectangular frame 2 represents the transition of the gate voltage Vgs.

In FIG. 7B, a transition of the gate voltage Vgs due to the mirror noise is illustrated in a region surrounded by a thick line. In the switching circuit 200*b*, as described above, the ferrite bead FB for suppressing the oscillation noise is provided on the path between the GND potential side of the mirror clamp circuit 103 and the source terminal S. The mirror noise propagated via the connection point T3 is propagated to the GND potential to which the source terminal S of the semiconductor device 102 is connected via the transistor Qs of the mirror clamp circuit 103 and the ferrite bead FB provided in the gate driver 101. The mirror noise whose voltage fluctuation range is once suppressed by the mirror clamp circuit 103 is increased by the inductor of the ferrite bead FB and propagates to the GND potential to which the source terminal S of the semiconductor device 102 is connected. Therefore, as illustrated in the transition of the gate voltage Vgs in the thick line circle in FIG. 7B, it can be seen that the voltage fluctuation range due to the mirror noise is relatively larger than the voltage fluctuation range illustrated in the transition of the gate voltage Vgs in the thick line circle in FIG. 6B. In the mode in which the ferrite bead FB for suppressing the oscillation noise exists on the path between the GND potential side of the mirror clamp circuit 103 and the source terminal S, it can be seen that a sufficient mirror noise suppression effect at turn-on cannot be obtained.

Figure 8B:
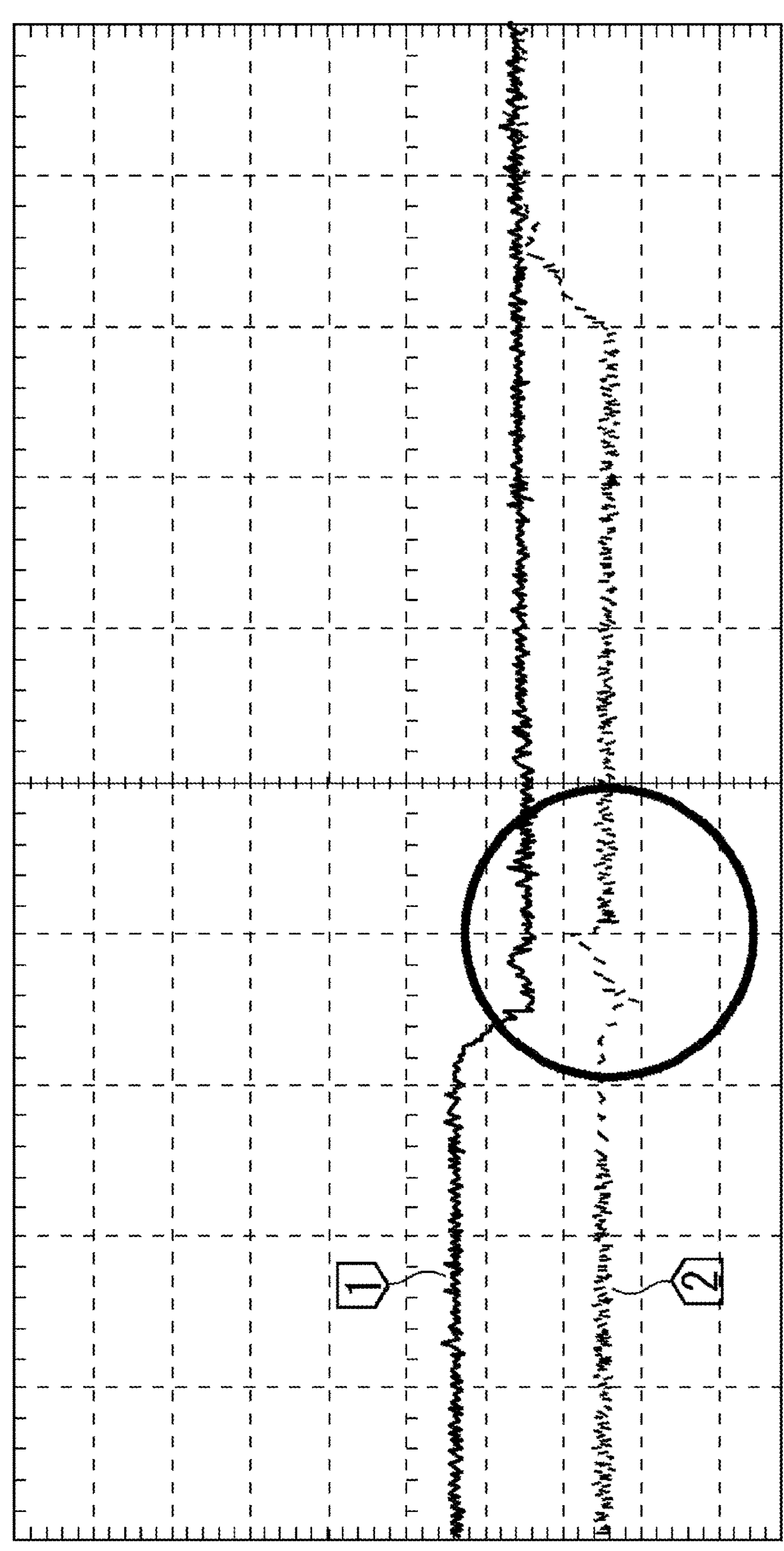

Next, a test result at turn-off will be described. FIGS. 8A and 8B are diagrams illustrating a result of the evaluation test when the switching circuit 100 according to the example is turned off. FIG. 8A illustrates a circuit configuration of the switching circuit 100 #1 similar to that of FIG. 6A, and FIG. 8B illustrates a state of mirror noise with respect to the inter-terminal voltage Vds and the gate voltage Vgs measured under the above-described evaluation condition. An alternate long and short dash line arrow in FIG. 8A indicates a propagation path of the mirror noise propagated through the drain terminal D and the gate terminal G when the semiconductor device 102 is turned off. Furthermore, in FIG. 8B, the vertical axis represents a relative magnitude of the measured voltage fluctuation, the horizontal axis represents time, and the graph indicated by a rectangular frame 1 represents the transition of the voltage (inter-terminal voltage) Vds applied between the drain terminal D and the source terminal S when the semiconductor device is turned off. Similarly, a graph indicated by a rectangular frame 2 represents the transition of the gate voltage Vgs.

A transition of the gate voltage Vgs due to the mirror noise at turn-off is illustrated in a region surrounded by a thick line in FIG. 8B. As indicated by the transition of the gate voltage Vgs in the thick line circle, it can be seen that the voltage fluctuation range due to the mirror noise is minimized even at the time of turn-off. This is because the ferrite bead FB does not exist in the path (dashed-dotted line arrow) branched via the connection point T3 and through which the mirror noise propagates, so that the suppressing effect of the mirror clamp circuit 103 provided on the path can be sufficiently exhibited.

Figure 9A:
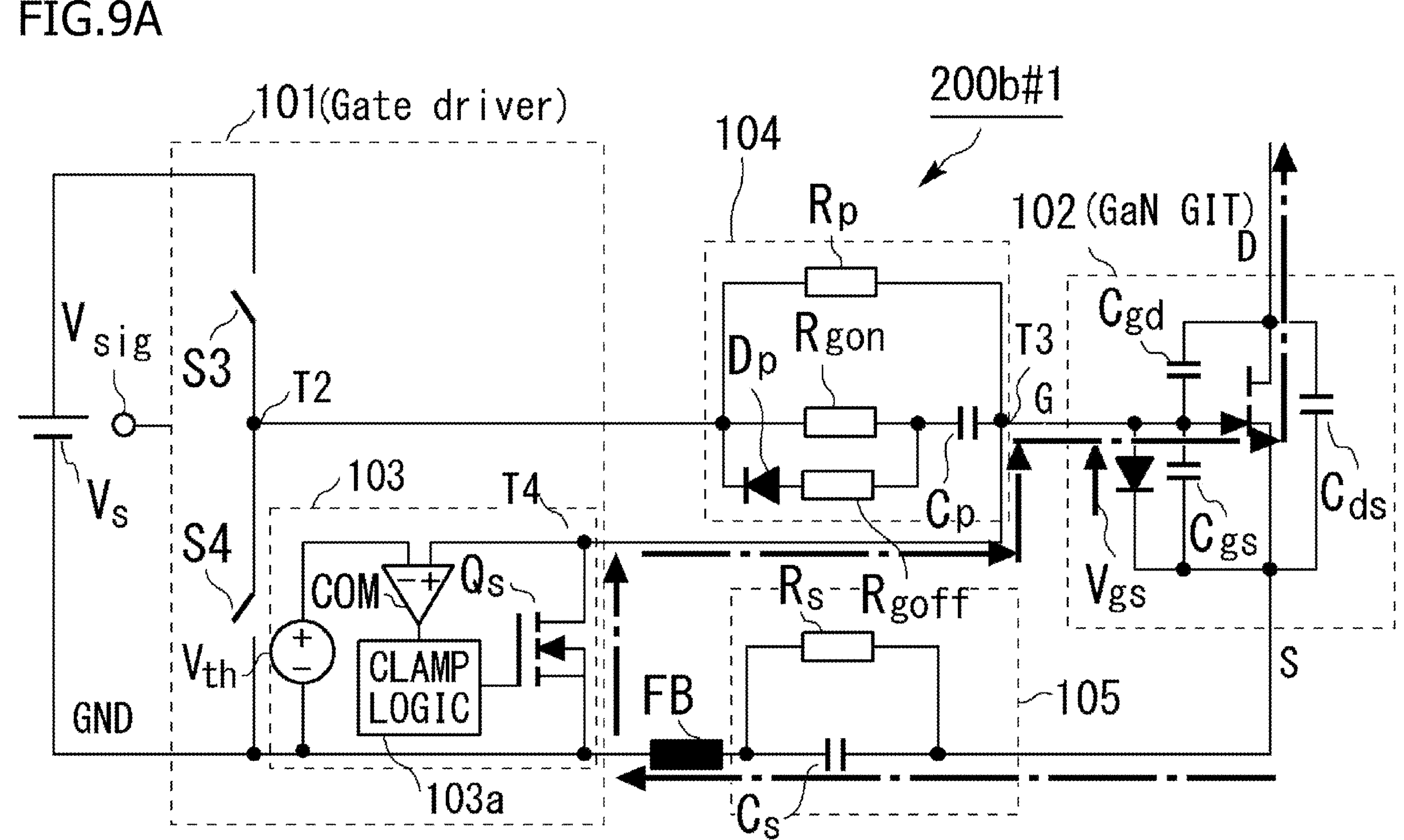
FIGS. 9A and 9B are diagrams illustrating a result of an evaluation test of mirror noise suppression at the time of turn-off of a switching circuit according to a comparative mode of the present invention.
Figure 9B:
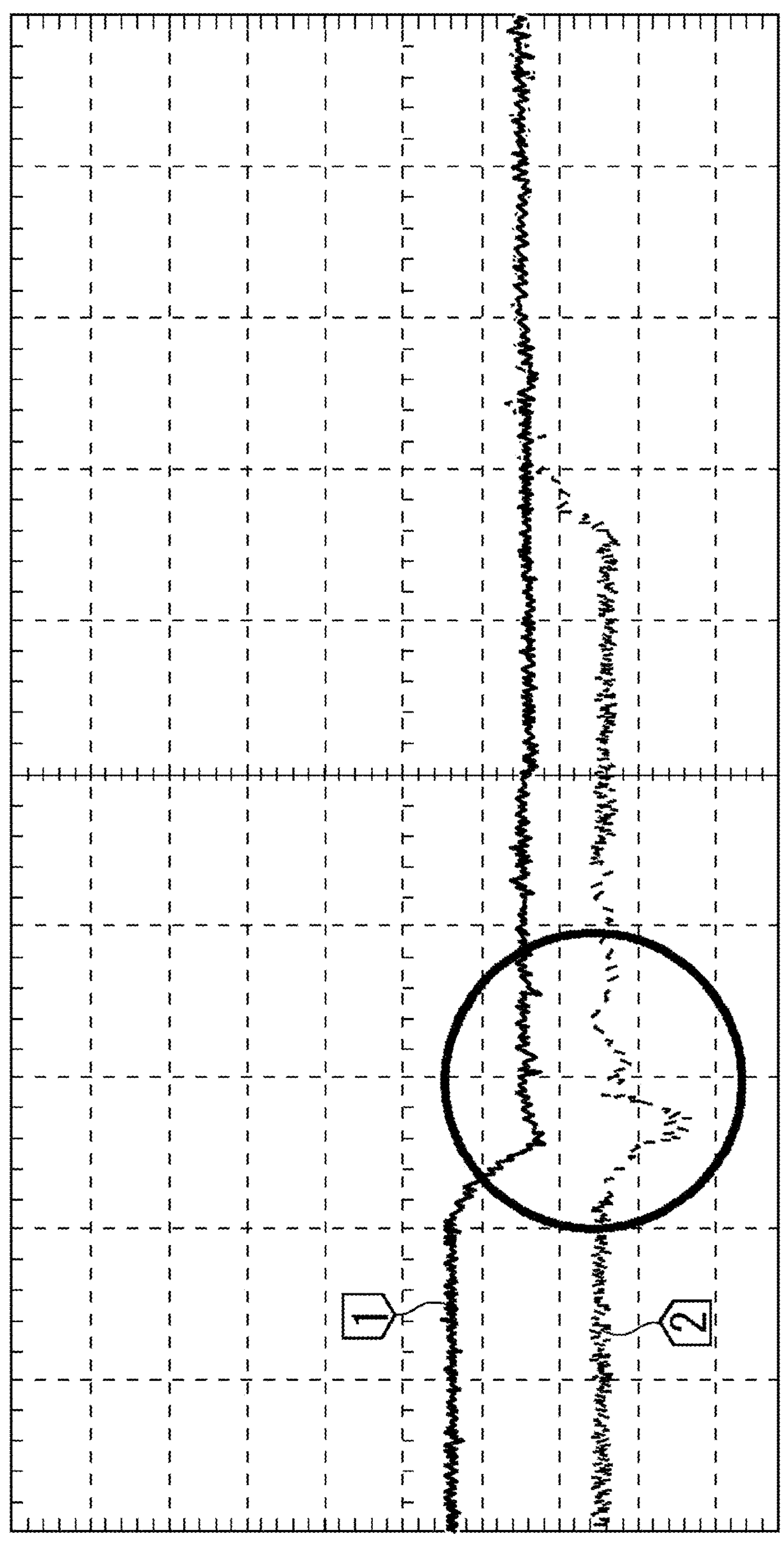

FIGS. 9A and 9B are diagrams illustrating a result of the evaluation test at turn-off by the switching circuit 200*b*. FIG. 9A illustrates a circuit configuration of a switching circuit 200*b* #1, and FIG. 9B illustrates a state of mirror noise with respect to the inter-terminal voltage Vds and the gate voltage Vgs measured under the above-described evaluation conditions. An alternate long and short dash line arrow in FIG. 9A, a vertical axis and a horizontal axis in FIG. 9B, and rectangular frames 1 and 2 are the same as those in FIGS. 8A and 8B.

In FIG. 9B, a transition of the gate voltage Vgs due to the mirror noise at the time of turn-off is illustrated in a region surrounded by a thick line. As illustrated in the transition of the gate voltage Vgs in the thick line circle in FIG. 9B, it can be seen that the voltage fluctuation range due to the mirror noise is relatively larger than the voltage fluctuation range illustrated in the transition of the gate voltage Vgs in the thick line circle in FIG. 8B. This is because the ferrite bead FB for suppressing the oscillation noise exists on the path between the GND potential side of the mirror clamp circuit 103 and the source terminal S, and thus a sufficient mirror noise suppression effect cannot be obtained similarly to at the time of turn-on.

As described above, the switching circuit 100 according to the example can be configured such that the ferrite bead FB is provided immediately near the gate driver 101, and the connection point T3 on the path where the ferrite bead FB and the gate terminal G of the semiconductor device 102 are connected and the input end (connection point T4) of the mirror clamp circuit 103 are connected. In the switching circuit 100 according to the example, it is possible to separate the closed loop of the propagation path through which the oscillation noise propagates via the GND potential and the closed loop of the propagation path of the mirror noise accompanying the turn-on and turn-off of the semiconductor device 102. As a result, the oscillation noise propagated via the GND potential can be suppressed by the inductor of the ferrite bead FB, and the effect of suppressing the mirror noise propagated by the mirror clamp circuit 103 connected via the connection point T3 can be sufficiently enhanced. According to the switching circuit 100 of the example, it is possible to provide a technique capable of suppressing the oscillation noise of the semiconductor device and suppressing the mirror noise.

Modification 1

Figure 10:
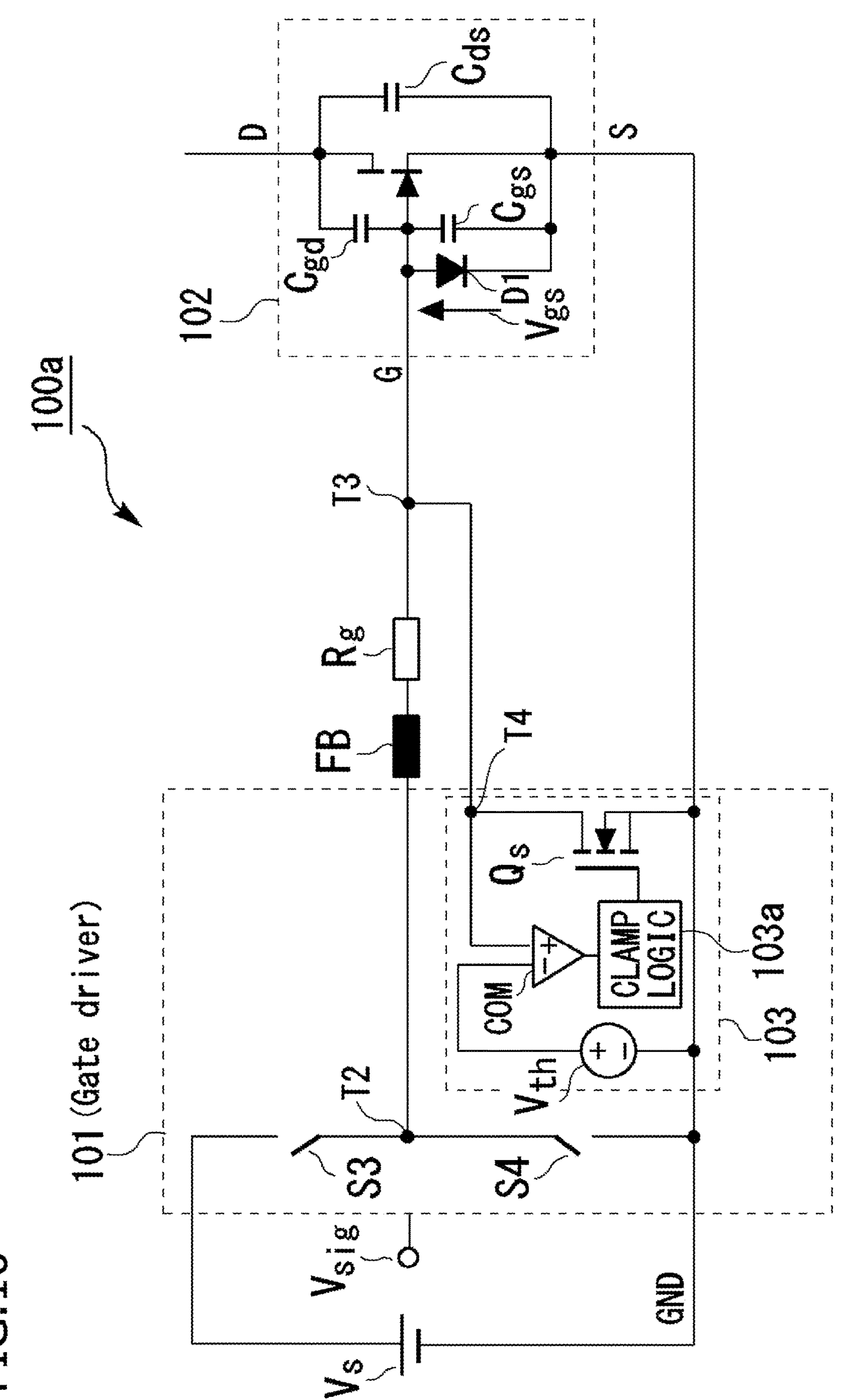
FIG. 10 is a circuit diagram illustrating a circuit configuration of a switching circuit according to Modification 1 of the present invention.

FIG. 10 is a circuit diagram illustrating a circuit configuration of a switching circuit 100*a* according to Modification 1. The switching circuit 100*a* according to Modification 1 has a mode in which a gate resistor Rg connected in series with a ferrite bead FB is provided in the circuit configuration. That is, one end of the ferrite bead FB provided immediately near the gate driver 101 is connected to the connection point T2 of the gate driver 101, and the other end is connected to one end of the gate resistor Rg. The other end of the gate resistor Rg is connected to the connection point T3 provided in a path connected to the gate terminal G. Therefore, the same effects as those of the switching circuit 100 of Example 1 can be obtained also in Modification 1. Then, in Modification 1, since the rise time (slew rate) of the gate voltage applied to the gate terminal G can be changed by adding the gate resistor Rg, the switching speed related to turn-on and turn-off in the semiconductor device 102 can be changed.

Modification 2

Figure 11:
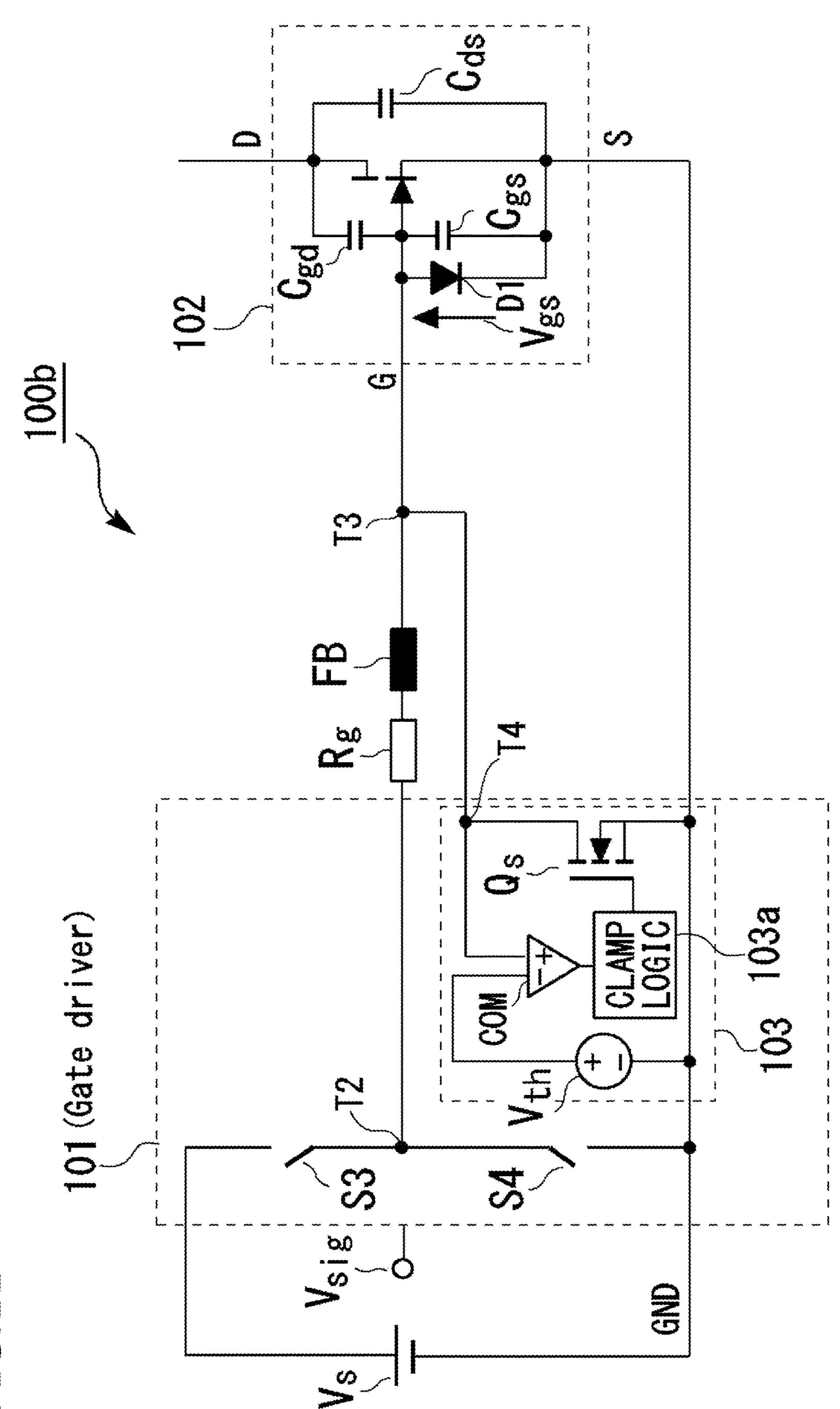
FIG. 11 is a circuit diagram illustrating a circuit configuration of a switching circuit according to Modification 2 of the present invention.

In the switching circuit 100*a* according to Modification 1, a position of the gate resistor Rg connected in series with the ferrite bead FB may be provided on a side of the gate driver 101. FIG. 11 is a circuit diagram illustrating a circuit configuration of a switching circuit 100*b* according to Modification 2. In the switching circuit 100*b* according to Modification 2, one end of the gate resistor Rg is connected to the connection point T2 of the gate driver 101, and the other end is connected to one end of the ferrite bead. The other end of the ferrite bead FB is connected to the connection point T3 provided in a path connected to the gate terminal G. Also in the mode of the switching circuit 100*b* illustrated in FIG. 11, the same effects as those of Modification 1 can be obtained. In Modifications 1 and 2, the gate resistor Rg corresponds to an example of a “resistance element”.

Modification 3

Figure 12:
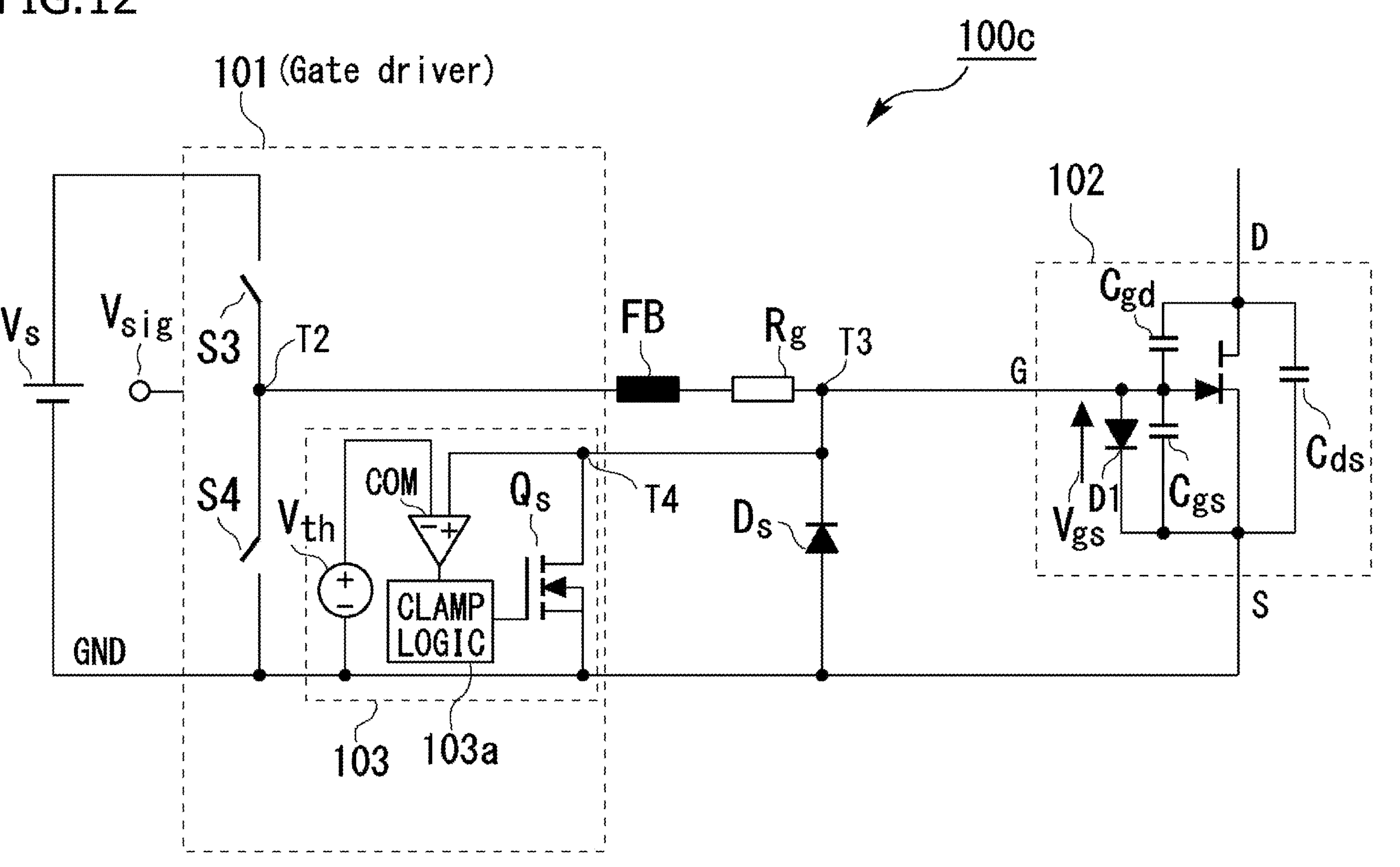
FIG. 12 is a circuit diagram illustrating a circuit configuration of a switching circuit according to Modification 3 of the present invention.

FIG. 12 is a circuit diagram illustrating a circuit configuration of a switching circuit 100*c* according to Modification 3. The switching circuit 100*c* according to Modification 3 has a mode in which a Schottky diode Ds is further provided in the circuit configuration of the switching circuit 100*a* according to Modification 1. Note that FIG. 12 illustrates a mode in which the circuit configuration of the switching circuit 100*a* according to Modification 1 includes the Schottky diode Ds, but the circuit configuration of the switching circuit 100*b* according to Modification 2 may include the Schottky diode Ds. As illustrated in FIG. 12, the Schottky diode Ds is provided between the connection point T3 and the GND potential, and the anode and the cathode of the Schottky diode Ds are connected to the GND potential and the connection point T3, respectively. With such a circuit configuration, the impedance of the current path through which the switching noise (mirror noise) propagates can be reduced, so that the effect of reducing the switching noise (mirror noise) accompanying the turn-on and turn-off of the semiconductor device 102 can be further improved. Note that a connection position of the cathode of the Schottky diode Ds may be a path through which the connection point T3 and the connection point T4 are connected. In Modification 3, the Schottky diode Ds corresponds to an example of a "diode element".

Modification 4

Figure 13:
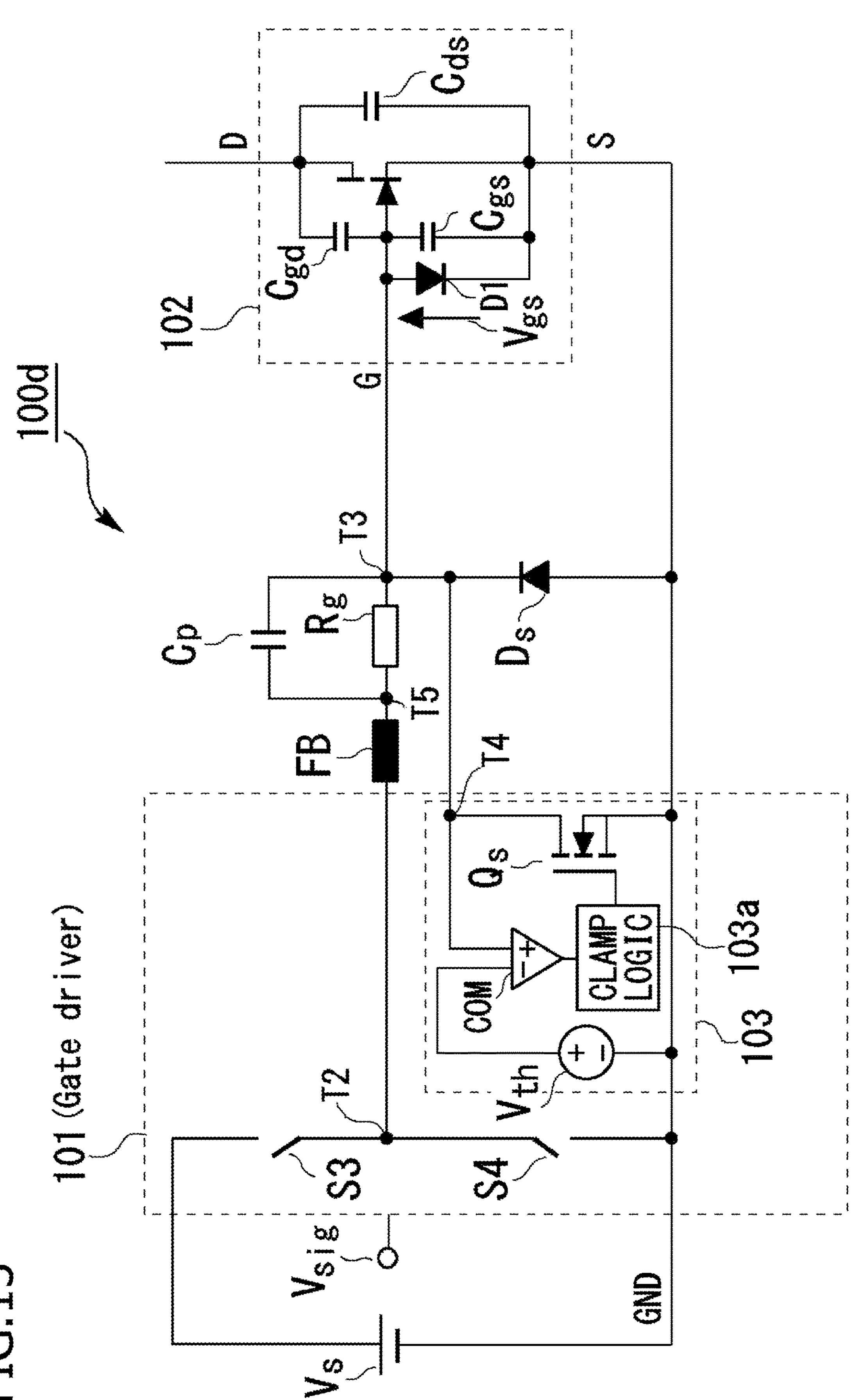
FIG. 13 is a circuit diagram illustrating a circuit configuration of a switching circuit according to Modification 4 of the present invention.

FIG. 13 is a circuit diagram illustrating a circuit configuration of a switching circuit 100*d* according to Modification 4. The switching circuit 100*d* according to Modification 4 has a mode in which a capacitor Cp is further provided in the circuit configuration of the switching circuit 100*c* according to Modification 3. As illustrated in FIG. 13, one end of the capacitor Cp is connected to a connection point T5 between the ferrite bead FB and the gate resistor Rg, and the other end is connected to the connection point T3. By adding the capacitor Cp connected in parallel to the gate resistor Rg, the switching speed related to the turn-on and turn-off of the semiconductor device 102 can be increased, so that the switching loss in the switching circuit can be expected to be reduced. In Modification 4, the capacitor Cp corresponds to an example of a "capacitor element".

Others

The above embodiments are merely examples, and the disclosure of the embodiments can be appropriately modified to implement without departing from the gist of the embodiments. The processing and methods described in the present disclosure can be implemented in arbitrary combination as long as no technical contradiction occurs.

Furthermore, the processing described as being performed by one circuit or device may be shared and executed by a plurality of circuits or devices. Alternatively, the processing described as being performed by different circuits or devices may be executed by one circuit or device.

Note that, in the following, the components of the present invention will be described with reference symbols used in the drawings in order to allow the components of the present invention and the configurations of the example to be compared.

Invention 1

A switching circuit (100) including:

a switching device (102) configured to conduct or open a state between a drain terminal (102, G) and a source terminal (102, S) based on a voltage applied between a gate terminal (102, D) and the source terminal (102, S);

a drive circuit (101) including a first switch element (101, S3) having one end connected to a positive electrode side of a control power supply (Vs) and the other end connected to an output end (101, T2), and a second switch element (101, S4) having one end connected to the output end (101, T2) and the other end connected to a reference potential (GND) to which a negative electrode side of the control power supply (Vs) is connected, the drive circuit being configured to open and close the first switch element (101, S3) and the second switch element (101, S4) in accordance with a predetermined control signal (Vsig), generate a drive voltage (Vgs) for driving the switching device (102), and output the generated drive voltage (Vgs) to the gate terminal (102, G) of the switching device (102) via the output end (101, T2);

a clamp circuit (103) including a third switch element (103, Qs) configured to conduct between the reference potential (GND) of the drive circuit (101) and a connection point (T3) of a path connecting the output end (101, T2) of the drive circuit (101) and the gate terminal (G) of the switching device (102) based on a comparison result between a threshold potential (Vth) generated based on the reference potential (GND) of the drive circuit (101) and a potential at the connection point (T3); and a ferrite inductor (FB) provided immediately near the output end (101, T2) of the drive circuit (101), and having one end connected to the output end (101, T2) and the other end connected to the connection point (T3).

REFERENCE SIGNS LIST

100, 100*a*, 100*b*, 100*c*, 100*d*, 100 #1, 200*a*, 200*b*, 200*ba* #1, 300 switching circuit
101, 301 gate driver
102, 302 semiconductor device (switching device)
103 mirror clamp circuit
104, 105, 303 gate resistance adjustment circuit
FB ferrite bead
T2, T3, T4, T5 connection point
D1 parasitic diode
Ds Schottky diode
Qs transistor (third switch element)
Rg gate resistor
Cp capacitor
Cgd, Cgs, Cds capacitor (parasitic capacitance)

The invention claimed is:

1. A switching circuit comprising:

a switching device configured to conduct or open a state between a drain terminal and a source terminal based on a voltage applied between a gate terminal and the source terminal;

a drive circuit including a first switch element having one end connected to a positive electrode side of a control power supply and an other end connected to an output end, and a second switch element having one end connected to the output end and an other end connected to a reference potential to which a negative electrode side of the control power supply is connected, the drive circuit being configured to open and close the first switch element and the second switch element in accordance with a predetermined control signal, generate a drive voltage for driving the switching device, and output the generated drive voltage to the gate terminal of the switching device via the output end;

a clamp circuit including a third switch element configured to conduct between the reference potential of the drive circuit and a connection point of a path connecting the output end of the drive circuit and the gate terminal of the switching device based on a comparison result between a threshold potential generated based on the reference potential of the drive circuit and a potential at the connection point; and a ferrite inductor provided immediately near the output end of the drive circuit, and having one end connected to the output end and an other end connected to the connection point, wherein the ferrite inductor is disposed in series between the output end of the drive circuit and the connection point, wherein the connection point is located on a gate terminal side of the ferrite inductor, and wherein when the third switch element conducts, a closed loop is formed through the gate terminal of the switching device, the connection point, the third switch element, and the reference potential, and the ferrite inductor is physically disposed outside the closed loop to separate a propagation path of an oscillation noise and a propagation path of mirror noise.

2. The switching circuit according to claim 1, further comprising a resistance element connected in series with the ferrite inductor between the output end of the drive circuit and the connection point.

3. The switching circuit according to claim 1, further comprising a diode element having an anode connected to the reference potential of the drive circuit and a cathode connected to the connection point.

4. The switching circuit according to claim 2, wherein a capacitor element is connected in parallel to the resistance element connected in series with the ferrite inductor.

5. The switching circuit according to claim 1, wherein the ferrite inductor comprises an equivalent circuit having an inductor and a resistor.

6. The switching circuit according to claim 1, wherein the switching device includes a wide bandgap semiconductor including at least a SiC semiconductor or a GaN semiconductor.

7. A power converter comprising a switching circuit according to claim 1 in a configuration.

* * * * *